(12) United States Patent
Zur

(10) Patent No.: US 6,864,484 B1
(45) Date of Patent: Mar. 8, 2005

(54) DIGITAL DETECTOR FOR X-RAY IMAGING

(75) Inventor: Albert Zur, Ganei Tikva (IL)

(73) Assignee: Edge Medical Devices, LTD (IL)

( * ) Notice: Subject to any disclaimer, the term of this patent is extended or adjusted under 35 U.S.C. 154(b) by 0 days.

(21) Appl. No.: 09/806,187

(22) PCT Filed: Jul. 26, 1999

(86) PCT No.: PCT/IL99/00409

§ 371 (c)(1),
(2), (4) Date: Jul. 16, 2001

(87) PCT Pub. No.: WO01/08224

PCT Pub. Date: Feb. 1, 2001

(51) Int. Cl.$^7$ .................................................. G01T 1/24

(52) U.S. Cl. ............................ 250/370.09; 250/370.01; 250/370.13

(58) Field of Search ........................ 250/370.09, 370.01, 250/370.13, 370.14

(56) References Cited

U.S. PATENT DOCUMENTS

| | | | |
|---|---|---|---|
| 4,176,275 A | 11/1979 | Korn et al. | 250/213 |
| 4,268,750 A | 5/1981 | Cowart | |
| 4,457,010 A | 6/1984 | Jenkins et al. | 378/167 |
| 4,663,774 A | 5/1987 | Saffer | |
| 4,951,305 A | 8/1990 | Moore et al. | 378/147 |
| 5,008,920 A | 4/1991 | Gralak | 378/185 |
| 5,084,911 A | 1/1992 | Sezan et al. | |
| 5,276,333 A | 1/1994 | Robertson | 250/484.4 |
| 5,313,066 A * | 5/1994 | Lee et al. | 250/370.09 |
| 5,317,407 A | 5/1994 | Michon | |
| 5,440,130 A | 8/1995 | Cox et al. | |
| 5,508,507 A | 4/1996 | Nelson et al. | 250/214 |
| 5,510,626 A | 4/1996 | Nelson et al. | |
| 5,608,775 A | 3/1997 | Hassler et al. | |

(List continued on next page.)

FOREIGN PATENT DOCUMENTS

| | | |
|---|---|---|
| EP | 0 574 690 | 12/1993 |
| JP | 61096867 | 5/1996 |
| JP | 2000 139887 | 10/2000 |
| WO | WO 01/08224 | 2/2001 |

OTHER PUBLICATIONS

Patent Abstracts of Japan vol. 010, No. 275, Sep. 18, 1986 & JP 61 096867.
U.S. patent application No.: 09/233,327, filed Jan. 20, 1999, entitled: "X–Ray Imaging System".
U.S. patent application No.: 09/233,320, filed Jan. 20, 1999, entitled: "X–Ray Imaging System".
U.S. patent application No.: 09/292,316, filed Apr. 15, 1999, entitled: "X–Ray Imaging System".
Patent Abstracts of Japan vol. 010, No. 275, May 15, 1986 & JP 61 096867.
U.S. Patent Publication No. 2002/090055, Jul. 11, 2002.
Patent Abstracts of Japan vol. 2000, No. 8, Oct. 6, 2000 & JP 2000 139887.

*Primary Examiner*—Constantine Hannaher
*Assistant Examiner*—Otilia Gabor
(74) *Attorney, Agent, or Firm*—Bright & Lorig; Patrick F. Bright

(57) ABSTRACT

An X-ray imaging module having a multilayer ionizing radiation sensitive element operative to convert spatially modulated impinging X-ray radiation to a spatially modulated charge distribution. The multilayer ionizing radiation sensitive element has a substrate, a conductive layer overlying the substrate, an ionizing radiation sensitive layer overlying the conductive layer which converts ionizing radiation impinging thereon to charge carriers, and a blocking layer exposed to ionizing radiation and optical radiation, overlying the ionizing radiation sensitive layer. The blocking layer generally limits the passage of charges, of at least one polarity, therethrough and blocks optical radiation, of at least one spectral band, from penetrating therethrough, while permitting passage therethrough of ionizing radiation.

15 Claims, 13 Drawing Sheets

U.S. PATENT DOCUMENTS

| | | | |
|---|---|---|---|
| 5,627,377 A * | 5/1997 | Hamilton et al. ...... 250/370.13 |
| 5,648,660 A | 7/1997 | Lee et al. |
| 5,652,430 A | 7/1997 | Lee |
| 5,666,395 A | 9/1997 | Tsukamoto et al. ........ 378/98.4 |
| 5,668,375 A | 9/1997 | Petrick et al. |
| 5,677,539 A | 10/1997 | Apotovsky et al. |
| 5,751,783 A | 5/1998 | Granfors et al. |
| 5,801,385 A | 9/1998 | Endo et al. |
| 5,809,107 A | 9/1998 | Schmitt |
| 6,244,507 B1 | 6/2001 | Garland et al. ............. 235/383 |
| 6,434,218 B1 * | 8/2002 | Matsumoto ................. 378/155 |

* cited by examiner

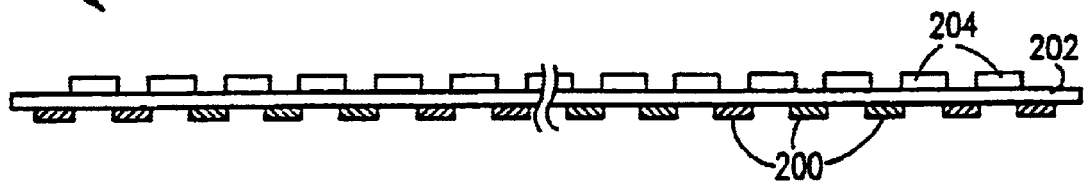
FIG. 5
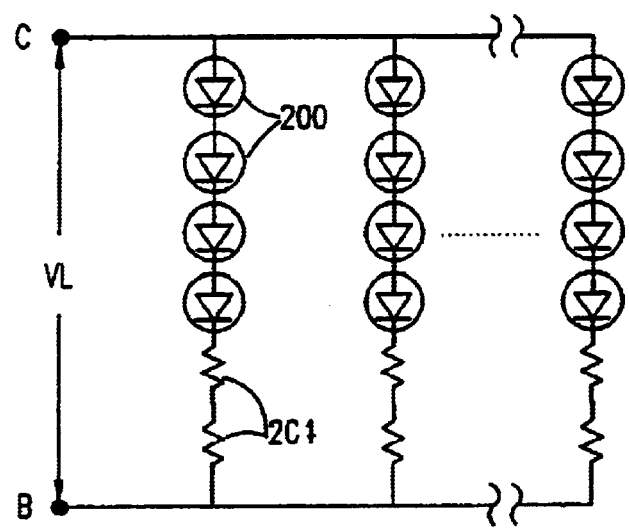
FIG. 6
FIG. 7
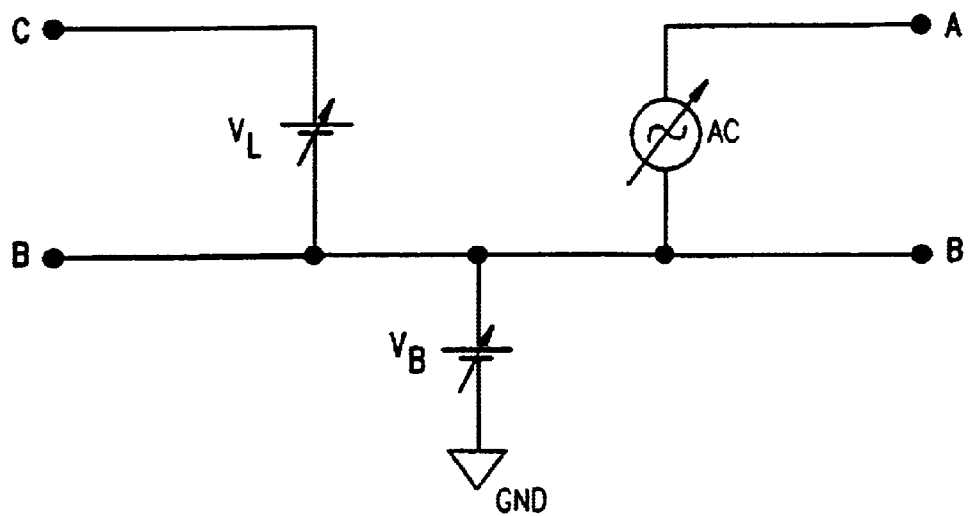

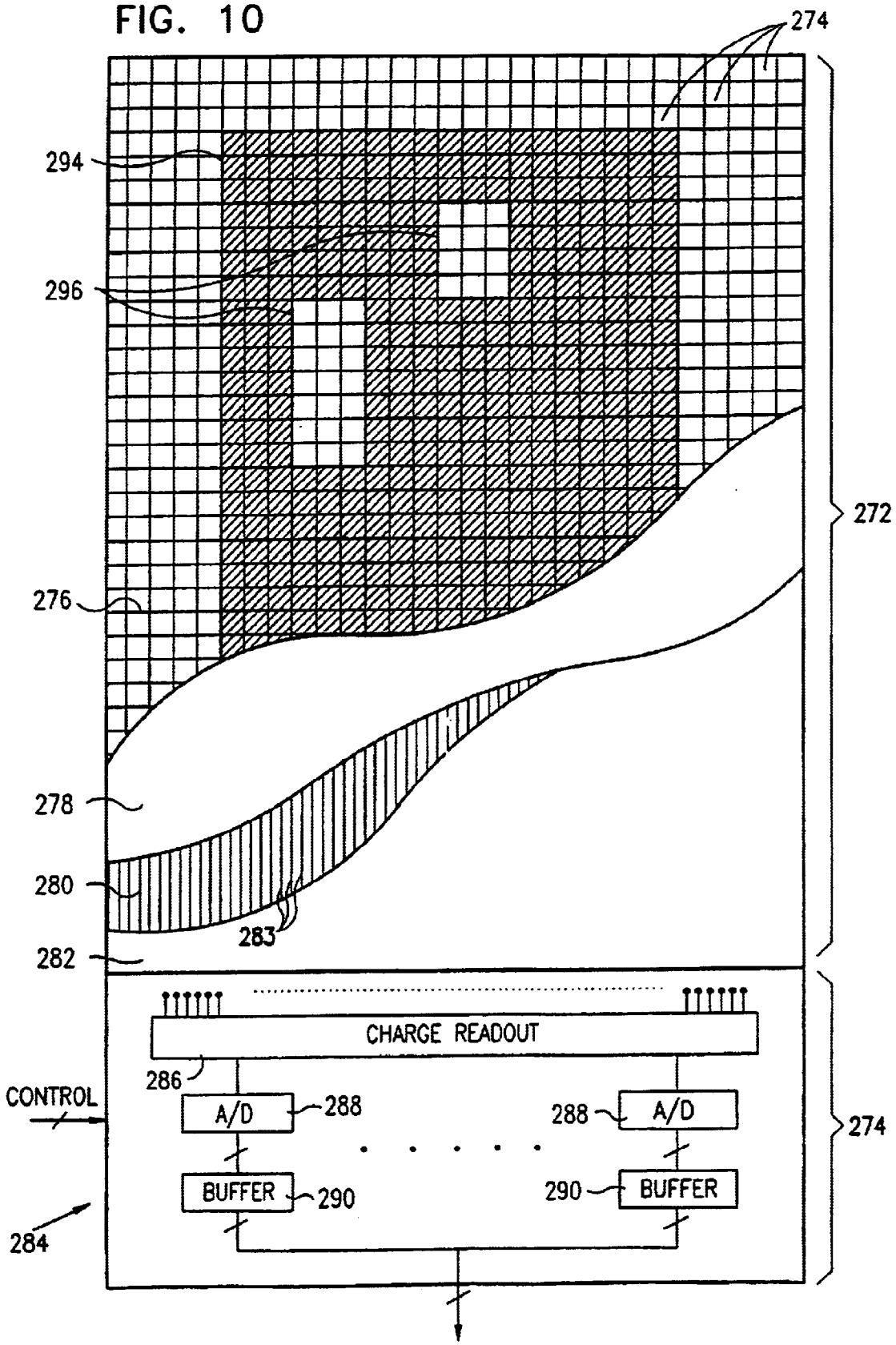

DIGITAL DETECTOR FOR X-RAY IMAGING

FIELD OF THE INVENTION

The present invention relates to systems and methods in the field of ionizing radiation imaging and more particularly to a system and method for digital detection of X-ray images.

BACKGROUND OF THE INVENTION

There are described in the patent literature numerous systems and methods for the recording of X-ray images. Conventional X-ray imaging systems use an X-ray sensitive phosphor screen and a photosensitive film to form visible analog representations of modulated X-ray patterns. The phosphor screen absorbs X-ray radiation and emits visible light. The visible light exposes the photosensitive film to form a latent image of the X-ray pattern. The film is then chemically processed to transform the latent image into a visible analog representation of the X-ray pattern.

Recently, there have been proposed systems and methods for detection of static and or dynamic X-ray images. These digital X-ray systems and methods provide digital representations of X-ray images in which the X-ray image is recorded as readable electrical signals, thus obviating the need for films and screen in the imaging process. Digital X-ray systems typically rely on direct conversion of X-rays to charge carriers or alternatively indirect conversion in which X-rays are converted to light which is then converted to charge carriers.

Direct conversion approaches typically use an X-ray sensitive photoconductor such as amorphous selenium overlying a solid state element which comprises a solid state array having thin-film-transistors (TFT) or diodes coupled to an array of storage capacitors An example of a direct conversion approach is provided by U.S. Pat. No. 5,313,066 to Lee et al., which describes an X-ray image capturing element comprising a panel having a layered structure including a conductive layer comprising a plurality of discrete accessible microplates and a plurality of access electrodes and electronic components built on the panel.

A further example of a direct conversion approach is U.S. Pat. No. 5,652,430 to Lee which describes a radiation detection panel made up of an assembly of radiation detector sensors arrayed in rows and columns where each sensor includes a radiation detector connected to a charge storage capacitor and a diode.

Indirect conversion approaches typically use a scintillating material such as columnar cesium iodide overlying a solid state active matrix array comprising photodiodes. The X-rays are converted to light by the scintillating material and the light is converted to charge by the photodiodes. An example of an indirect approach is provided by U.S. Pat. No. 5,668,375 to Petrick et al. which describes a large solid state X-ray detector having a plurality of cells arranged in rows and columns composed of photodiodes.

A further example of an indirect approach is provided by U.S. Pat. No. 5,801,385 to Endo et. al which describes an X-ray image detector having a plurality of photoelectric conversion elements on an insulating substrate.

Direct and indirect conversion based digital X-ray detectors use charge storage matrices to retain imaging information, which is then electronically addressed, with stored charge read out taking place subsequent to exposure. In dynamic imaging such as fluoroscopy, "real-time" images are simulated by repeatedly reading the integrated radiation values of the storage matrix to provide a sufficiently high number of frames per second, e.g. 30 frames per second. Image information, which is retained in the charge storage matrix, is not available until after the end of the X-ray pulse, since the detectors are operated in a storage mode. Thus, measurements made from the current generation of digital detectors are not real-time.

For medical diagnosis, it is desirable to use the minimum X-ray exposure dose that will provide an image having acceptable contrast and brightness. Various X-ray examinations, when performed on patients with a variety of body types, may require varied doses to provide an image suitable for diagnostics. Thus, the dynamic range of a system suitable for all types of examinations may be as high as $10^4:1$.

The actual X-ray exposure dose for a specific X-ray examination may be selected using predetermined imaging exposure parameters and patient characteristics loaded from periodically updated lookup tables into a X-ray system console. Alternatively, the actual dose may be adjusted automatically using automatic exposure control devices, typically placed in front of the X-ray detector, to provide real-time control feedback to an X-ray source.

Automatic exposure control devices, which must operate in real-time, typically make use of a multi-chamber ion chamber or a segmented phototimer as described in U.S. Pat. No. 5,084,911. These devices sense radiation passing therethrough and provide a signal which terminates the X-ray exposure when a predetermined dose value, yielding a desired radiation density level, has been reached.

Prior to exposure, the chamber or chambers to be used are selected by the X-ray technologist, and the patient or X-ray detector is aligned therewith. Disadvantages of conventional exposure control devices include the fact that the real-time exposure signals are averaged over a fixed chamber area and do not directly correspond to the image information in a region of interest; the fact that devices located in front of the detector cause non-uniform attenuation of the X-rays and cause some of the radiation that would otherwise contribute to the signal at the detector to be lost; the fact that the devices are typically bulky and require external power sources; and the fact that the spectral sensitivity of the devices differs from that of the radiation image detector being used thus requiring corrections and calibrations for different X-ray tube voltage (kVp) values.

Efforts have been made to incorporate real-time exposure control into digital X-ray detectors, particularly those detectors based on the "indirect" conversion approach.

An example of apparatus for use in detecting real-time exposure information for an "indirect" scintillator based digital detector is described in U.S. Pat. No. 5,751,783 to Granfors et. al. This patent describes an exposure detection array of photodiodes positioned behind an imaging array of photodiodes. The exposure detection array, which is a separate component involving separate electronics, is used to detect light which passes through the imaging array in certain regions due to gaps between adjacent pixels caused by a relatively low pixel fill factor. Pixels are regionally grouped to provide regional density measurements.

Alternatively, for digital X-ray imaging, special methods have been proposed allowing digital detectors to sample the exposure prior to the imaging exposure using a two step method, thus simulating real-time exposure information. An example of a two-step exposure method is described in U.S. Pat. No. 5,608,775 to Hassler et al. In that method exposure information for a digital detector is generated by first exposing the detector to a "calibrating" pulse in which an X-ray exposure of short duration produces an exposure in a solid state detector, which is then processed to calculate the X-ray transparency of the object being imaged in order to determine an optimum X-ray dose.

SUMMARY OF THE INVENTION

There is thus provided in accordance with a preferred embodiment of the present invention, an integrated system for providing real-time exposure and integrated radiation information based on a new direct conversion digital X-ray detector suitable for ionizing radiation imaging, and in particular X-ray imaging for general radiography diagnostics.

There is thus provided in accordance with a preferred embodiment of the present invention a multilayer ionizing radiation sensitive element having a substrate, a conductive layer overlying the substrate, an ionizing radiation sensitive layer overlying the conductive layer, operative to convert ionizing radiation impinging thereon to charge carriers; and a blocking layer exposed to ionizing radiation and optical radiation, overlying the ionizing radiation sensitive layer, which generally limits the passage of charges, of at least one polarity, therethrough and blocks optical radiation, of at least one spectral band, from penetrating therethrough, while permitting passage therethrough of ionizing radiation.

Further in accordance with a preferred embodiment of the present invention the multilayer ionizing radiation sensitive element also includes an interstitial dielectric passivation layer disposed between the ionizing radiation sensitive layer and the blocking layer. The interstitial dielectric passivation layer is preferably formed of poly-para-xylylenes.

Still further in accordance with a preferred embodiment of the present invention, the multilayer ionizing radiation sensitive element also includes a charge buffer layer, disposed between the ionizing radiation sensitive layer and the conductive layer and which generally limits the passage of charges, of at least a second polarity, therethrough.

Preferably, the ionizing radiation sensitive layer is a photoconductor formed of doped amorphous selenium or amorphous selenium doped with arsenic and chlorine. Alternatively, the ionizing radiation sensitive layer is selected from the group consisting of a selenium alloy, lead iodide, lead oxide thallium bromide, cadmium telluride, cadmium zinc telluride, cadmium sulfide, and mercury iodide.

Further in accordance with a preferred embodiment of the present invention, the charge buffer layer is formed of amorphous arsenic triselenide.

Additionally in accordance with a preferred embodiment of the present invention, the blocking layer is formed of alkali doped selenium or alternatively of a dielectric polymer carrier loaded with selected pigments or dyes.

Still further in accordance with a preferred embodiment of the present invention, the conductive layer of multilayer ionizing radiation sensitive element is a patterned layer, selected from the group consisting of indium tin oxide (ITO), aluminum, gold, platinum, and chromium.

Moreover, in accordance with a preferred embodiment of the present invention, the substrate of the multilayer ionizing radiation sensitive element is selected from the group consisting of glass, ceramic, polycarbonate and metal coated with a dielectric material.

Additionally, in accordance with a preferred embodiment of the present invention, the at least one spectral band of optical radiation blocked by the blocking layer includes photons having energy higher than a characteristic band gap energy of said ionizing radiation sensitive layer and wherein optical radiation having photon energy lower than said band gap energy of said ionizing radiation sensitive layer generally penetrates through said blocking layer.

Still further in accordance with a preferred embodiment of the present invention, the ionizing radiation sensitive layer is sensitive to X-ray radiation.

There is also provided in accordance with another preferred embodiment of the present invention an elongate charge injection assembly including an elongate electrode embedded in a dielectric material, an exposed screen electrode, separated from the embedded electrode by the dielectric material; and at least one elongate dielectric wedge having an elongate metallized surface.

Preferably, the elongate charge injection assembly is operative to inject charge generally along the metallized surface of said elongate dielectric wedge.

Further in accordance with a preferred embodiment of the present invention, a floating AC voltage is applied between the elongate electrode and the exposed screen electrode and the metallized surface of the dielectric wedge and the exposed screen electrode are both biased to a DC potential relative to a ground reference.

Additionally in accordance with a preferred embodiment of the present invention, the substrate of elongate charge injection assembly is associated with the ground reference and the density and polarity of charge retained on the substrate following charge injection from the elongate charge injection assembly is generally determined by the value and polarity of said DC potential.

Yet further in accordance with a preferred embodiment of the present invention, the elongate electrode embedded in a dielectric material is a glass coated wire mounted on a dielectric rod, and the exposed screen electrode is a conducting wire space-wound to form coils around the glass coated wire that is mounted on the dielectric rod.

Preferably, the dielectric rod and the dielectric wedge are formed of a dielectric material selected from the group including glass, alumina and other dielectric ceramics.

Further in accordance with a preferred embodiment of the present invention, the elongate charge injection assembly includes a light source which is operative to project an elongate beam of optical radiation.

Preferably, the light source includes a plurality of light-emitting diodes and a plurality of resistors mounted on a rigid printed circuit board.

Still in further accordance with a preferred embodiment of the present invention, the elongate charge injection assembly is a scanning assembly.

There is also provided in accordance with another preferred embodiment of the present invention an ionizing radiation imaging module including: a multilayer ionizing radiation sensitive element having at least one conductive layer and operative to convert an impinging ionizing radiation image to a charge distribution; a charge injection assembly operative to inject charge into the multilayer ionizing radiation sensitive element; and readout circuitry coupled to the conductive layer of said multilayer ionizing radiation sensitive element; and wherein the charge injection assembly is operative to cause currents, corresponding to the charge distribution, to flow in the conductive layer providing a signal representation of the impinging ionizing radiation image.

Moreover, in accordance with a preferred embodiment of the present invention, the readout circuitry is removably coupled to the conductive layer.

Additionally in accordance with a preferred embodiment of the present invention the readout circuitry includes a plurality of multi-channel charge readout ASICs; and a plurality of analog-to-digital converters coupled to the multi-channel charge readout ASICs.

Preferably, the ionizing radiation is X-ray radiation.

There is also provided in accordance with another preferred embodiment of the present invention an X-ray imaging module including an X-ray imaging element, operative to convert spatially modulated impinging X-ray radiation to a spatially modulated charge distribution wherein the amplitude of the spatially modulated charge distribution is generally dependent upon the intensity and duration of the exposure; and an X-ray exposure sensor facing the X-ray imaging element and being operative to sense apparent surface voltages associated with the spatially modulated charge distribution in real-time during exposure in order to provide real-time X-ray exposure data.

Additionally in accordance with a preferred embodiment of the present invention the X-ray exposure data is imagewise.

Moreover, in accordance with a preferred embodiment of the present invention, the X-ray exposure sensor includes an X-ray permeable multilayer element having a first conducting layer facing said X-ray imaging element, a dielectric support layer, and real-time readout circuitry electrically coupled to the first conducting layer.

Preferably, the first conducting layer includes a plurality of plate electrodes electrically coupled to said real-time readout circuitry.

Additionally in accordance with a preferred embodiment of the present invention, the X-ray permeable multilayer element further includes a conductive fanout layer electrostatically shielded from the X-ray imaging element and a second dielectric layer electrically insulating the conductive fanout layer from the first conducting layer.

Yet further in accordance with a preferred embodiment of the present invention, the X-ray imaging module includes integrated data readout circuitry which is coupled to the X-ray imaging element and wherein the X-ray imaging module is operative to read out integrated X-ray radiation data corresponding to the spatially modulated charge distribution following X-ray exposure.

Moreover, in accordance with a preferred embodiment of the present invention, the real-time exposure data provided by said X-ray exposure sensor is used during integrated radiation data readout to enhance imaging. Additionally in accordance with a preferred embodiment of the present invention, the real-time exposure data is used in real time to control a controllable X-ray source to terminate X-ray exposure.

There is also provided in accordance with another preferred embodiment of the present invention a flat panel digital X-ray image detector including a casing having at least one X-ray permeable surface which encloses a first conductive layer, a second conductive layer and an X-ray radiation sensitive element positioned therebetween; and wherein the first conductive layer, the second conductive layer and the X-ray radiation sensitive element are operative such that, in response to impinging X-ray radiation, real-time exposure data is sensed from the first conductive layer and integrated radiation data is sensed from the second conductive layer.

In accordance with a preferred embodiment of the present invention, the flat panel X-ray image detector also includes real-time readout circuitry coupled to the first conductive layer and integrated data readout circuitry coupled to the second conductive layer.

Preferably, integrated radiation data is read out from the second conductive layer at a first spatial resolution and said real-time exposure data is read out from the first conductive layer at a second typically lower spatial resolution.

In accordance with a preferred embodiment of the present invention, a space separates between the first conductive layer and the X-ray radiation sensitive element.

There is also provided in accordance with another preferred embodiment of the present invention an ionizing radiation imaging module including an ionizing radiation sensor, operative to convert spatially modulated impinging ionizing radiation to a corresponding charge pattern and a charge injector, operative in an environment of at least approximately atmospheric pressure to inject charge onto the ionizing radiation sensor, wherein the amount of charge injected onto the ionizing radiation sensor at a given location corresponds to the charge density at that location prior to charge injection.

Preferably, charge injection causes measurable currents to flow in a conductive layer of the ionizing radiation sensor thereby providing a signal representation of the spatially modulated impinging ionizing radiation.

There is also provided in accordance with another preferred embodiment of the present invention a flat panel digital X-ray image detector including a casing having at least one X-ray permeable surface which encloses an X-ray sensitive element which is operative to retain a charge representation of spatially modulated X-ray imaging radiation impinging thereon and a scanner which is operative to provide a beam which scans over the X-ray sensitive element following exposure in order to read out said charge representation to provide a digital representation of the X-ray imaging radiation.

Preferably, the beam is a beam of injected charges.

There is also provided in accordance with another preferred embodiment of the present invention an ionizing radiation image detector including an ionizing radiation sensitive element operative to convert an impinging ionizing radiation image to a digital signal representation thereof and a source of optical radiation operative to project optical radiation onto the ionizing radiation sensitive element wherein optical radiation impingement onto the ionizing radiation sensitive element results in occupation of trap states without generally causing photogeneration of free charge carriers in the ionizing radiation sensitive element; and wherein the ionizing image radiation and the optical radiation impinge onto the ionizing radiation sensitive element from the same general direction.

There is also provided in accordance with another preferred embodiment of the present invention a method for detecting ionizing radiation images including the following steps: the step of providing an ionizing radiation sensing multilayer element; a scanning charge injector which is capable of injecting charges onto the multilayer element; and read circuitry coupled to the ionizing radiation sensing multilayer element, the step of sensitizing the ionizing radiation sensing multilayer element by creating a generally uniform charge distribution of a first value using the scanning charge injector; the step of exposing the sensitized ionizing radiation sensing multilayer element to ionizing radiation, thus causing charge redistribution over the ionizing radiation sensing multilayer element corresponding to the exposing ionizing radiation; the step of injecting charge into the ionizing radiation sensing multilayer element using the scanning charge injector, to create a generally uniform charge distribution of a second value wherein the amount of charge injected at each location of the ionizing radiation sensing multilayer element corresponds to the charge density at that location prior to charge injection and wherein currents, generally corresponding to the amount of injected charge, flow in the read circuitry; and the step of reading out the currents flowing in the read circuitry thereby providing a signal representation corresponding to the exposing ionizing radiation.

Further in accordance with a preferred embodiment of the present invention, the second charge distribution value is selected so as to reduce a DC component, associated with the spatial Fourier frequencies representing an ionizing radiation image, to provide a tone scale remapping function.

Moreover in accordance with a preferred embodiment of the present invention, the second charge distribution value is generally equal to the first charge distribution value thereby enabling the step of injecting charge to serve as the step of sensitizing the ionizing radiation sensing multilayer element.

In further accordance with a preferred embodiment of the present invention the step of providing also includes the step of providing a scanning light source which projects an optical radiation beam onto the ionizing radiation sensing multilayer element and wherein the step of sensitizing the ionizing radiation sensing multilayer element includes the step of projecting an optical radiation beam resulting in the occupation of trap states within the ionizing radiation sensing multilayer element without directly photogenerating free charge carriers thereby reducing imaging ghost effects.

There is also provided in accordance with another preferred embodiment of the present invention a method for reducing image ghost effects during the detection of ionizing radiation images and including the steps of: providing an ionizing radiation sensing multilayer element having an external optical radiation blocking layer, providing a source of optical radiation which impinges on the ionizing radiation sensing multilayer element in a first impinging direction; and the step of projecting an optical radiation beam from the source of optical radiation over the ionizing radiation sensing multilayer element from the first impinging direction prior to exposure to X-ray wherein the optical radiation beam results in occupation of trap states within ionizing radiation sensing multilayer element without directly photogenerating free charge carriers thereby reducing imaging ghost effects.

There is also provided in accordance with another preferred embodiment of the present invention a method for detecting X-ray radiation exposure including the steps of providing an X-ray radiation sensing multilayer element which is operative to convert an impinging radiation image to a corresponding apparent surface voltage pattern; and the step of sensing the apparent surface voltage pattern during exposure to provide X-ray radiation exposure data.

Preferably, the provided X-ray radiation exposure data is imagewise.

Reference is made throughout the specification to X-ray radiation, it being understood that the present application is not limited to X-ray radiation, but extends as well to all suitable types of ionizing radiation, of which X-ray radiation is one example.

BRIEF DESCRIPTION OF THE DRAWINGS

The present invention will be understood and appreciated more fully from the following detailed description, taken in conjunction with the drawings in which:

FIG. 5 is a simplified illustration of an elongate light source useful in the structure shown in FIG. 4.

FIG. 6 is a simplified electrical diagram of the elongate light source of FIG. 5.

FIG. 7 is a simplified electrical circuit diagram of a power driver driving the structure shown in FIG. 4.

FIG. 10 is a simplified partially cut-away, partially pictorial, partially block diagram illustration of an Apparent Surface Voltages (ASV) sensor forming part of the image detection module shown in FIGS. 2A, 2B and 3.

DETAILED DESCRIPTION OF PREFERRED EMBODIMENTS

Figure 1:
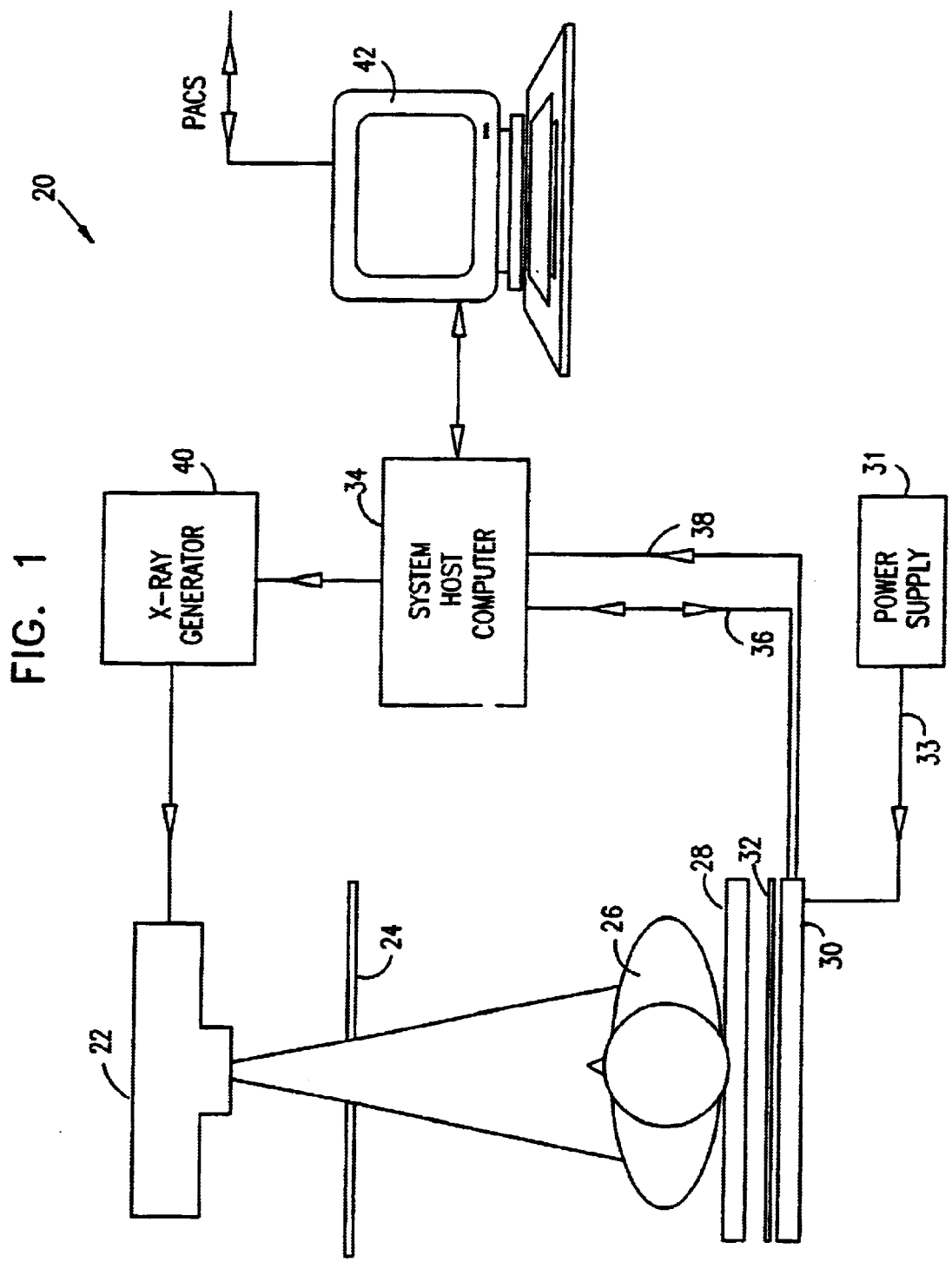
FIG. 1 illustrates a digital X-ray system incorporating an enhanced image detection module in accordance with a preferred embodiment of the present invention.

Reference is now made to FIG. 1 which illustrates a digital X-ray system in accordance with a preferred embodiment of the present invention.

FIG. 1 illustrates a digital X-ray imaging system 20, which includes an X-ray source 22 from which an X-ray beam is emitted. A collimator 24 preferably shapes the emitted X-ray beam. The X-ray beam impinges upon a patient 26 preferably lying on or standing in front of a X-ray permeable patient support 28. The X-ray beam then impinges upon an image detection module 30, which is preferably a flat panel digital X-ray detector as described hereinbelow. The image detection module 30 is preferably associated with an external power supply 31 which provides power via a power supply cable 33. The X-ray imaging system may include a radiation anti-scatter grid 32 as known in the art.

Typically, the collimator 24 includes two sets of movable lead shutters which are arranged to restrict and shape the X-ray beam to define a desired irradiation field area which is typically rectangular. By restricting the irradiated field to a relevant region of the patient's anatomy, the overall dose of the X-ray to the patient may be reduced and X-ray image contrast is enhanced due to reduced scattering of primary X-ray radiation.

Preferably, the operation of the image detection module 30 is controlled by a system host computer 34 typically including a controller and data processor. A communications link 36, which may use a standard communications protocol such as RS232 or USB, preferably connects the image detection module 30 to the system host computer 34 and is used for communication of control information. High speed transfer of imaging data from image detection module 30 to the data processor of system host computer 34 is preferably handled by a high speed data link 38 which may employ an electrical or fiber optic link. Alternately, the high speed data link 38 may be wireless.

The controller of system host computer 34 preferably controls an X-ray generator 40 to set the exposure parameters of X-ray source 22 such as tube voltage (kVp), tube current (milliamperes) and the maximum expected duration of an X-ray exposure pulse. These parameters are typically set in accordance with the requirements of a specific patient examination under operator control. In accordance with a preferred embodiment of the present invention, the actual duration of X-ray exposure is determined automatically as described hereinbelow.

In accordance with an alternative embodiment of the present invention, the exposure parameters of X-ray generator 40 may be input manually to a generator console (not shown).

Digital X-ray system 20 also preferably includes a monitor 42 which serves as an image display station and preferably also includes a user interface to the system operator.

It is appreciated that image detection module 30 may be used with X-ray systems for diagnostic imaging such as general radiography and mammography.

In the non-limiting example described herein, a general radiography system such as those sold by Philips Medical Systems International or Siemens Medical Systems, Inc. may form part of digital X-ray imaging system 20, which typically operates in the following manner:

Patient data is input to the monitor 42 and the examination that is to be carried out is preferably selected from an examination library. In accordance with the patient data and examination type, suggested exposure parameters are provided to a technologist from look up tables stored in a database of system host computer 34. Exposure parameters selected by the technologist are forwarded to the X-ray generator 40. Prior to exposure the technologist positions the patient in front of or on the X-ray permeable patient support 28. The technologist then preferably adjusts the X-ray source 22 and collimator 24 to spatially define the irradiation field. Alternatively, operation of the collimator 24 may be automated, with electromechanical means and sensing devices used to position X-ray source 22 and/or lead shutters of the collimator 24.

After patient positioning, an X-ray exposure is initiated by the technologist at monitor 42 or by using a dedicated manual prepare and expose switch. During patient exposure, the X-ray beam impinges on the patient and is imagewise modulated as it passes through the patient anatomy. Thus spatially modulated radiation which contains information relating to the patient's anatomy impinges on the image detection module 30. In accordance with a preferred embodiment of the present invention, exposure data is generated in real-time by image detection module 30 and transferred in real-time to the data processor of system host computer 34 through data link 38.

It is appreciated that the same data link 38 may be used for transfer of both integrated radiation data and real-time exposure data as described hereinbelow. The real-time exposure data is used to provide enhanced real-time dose control obviating the need for an automatic exposure control device as in prior art methodologies. Moreover, the present invention provides exposure sensors which are flexible in terms of aperture size and location enabling real-time feedback to be employed for optimized dose control as described hereinbelow. This contrasts with prior art fixed aperture and fixed location density sensors associated with phototimers and other exposure control devices. The present invention may thus enable a lowering of the dose required to reach desired diagnostic image contrasts for a variety of different types of examination.

Preferably, upon termination of patient exposure, raw image data, comprising integrated radiation values representing a digital image, is read out and transferred from image detection module 30 to the data processor of system host computer 34 via data link 38. The raw image data is preferably calibrated and then image processed to provide a display on the monitor 42 corresponding to the object that was imaged.

The digital image is preferably stored in or retrieved from a Picture Archiving and Communications System (PACS) via standard network communication preferably using the Digital Imaging and Communications in Medicine (DICOM) protocol as known in the art. Alternatively or additionally, digital images may be exported to a hard copy output device, such as a laser imager, to provide an image on film or any other suitable substrate.

Figure 2A:
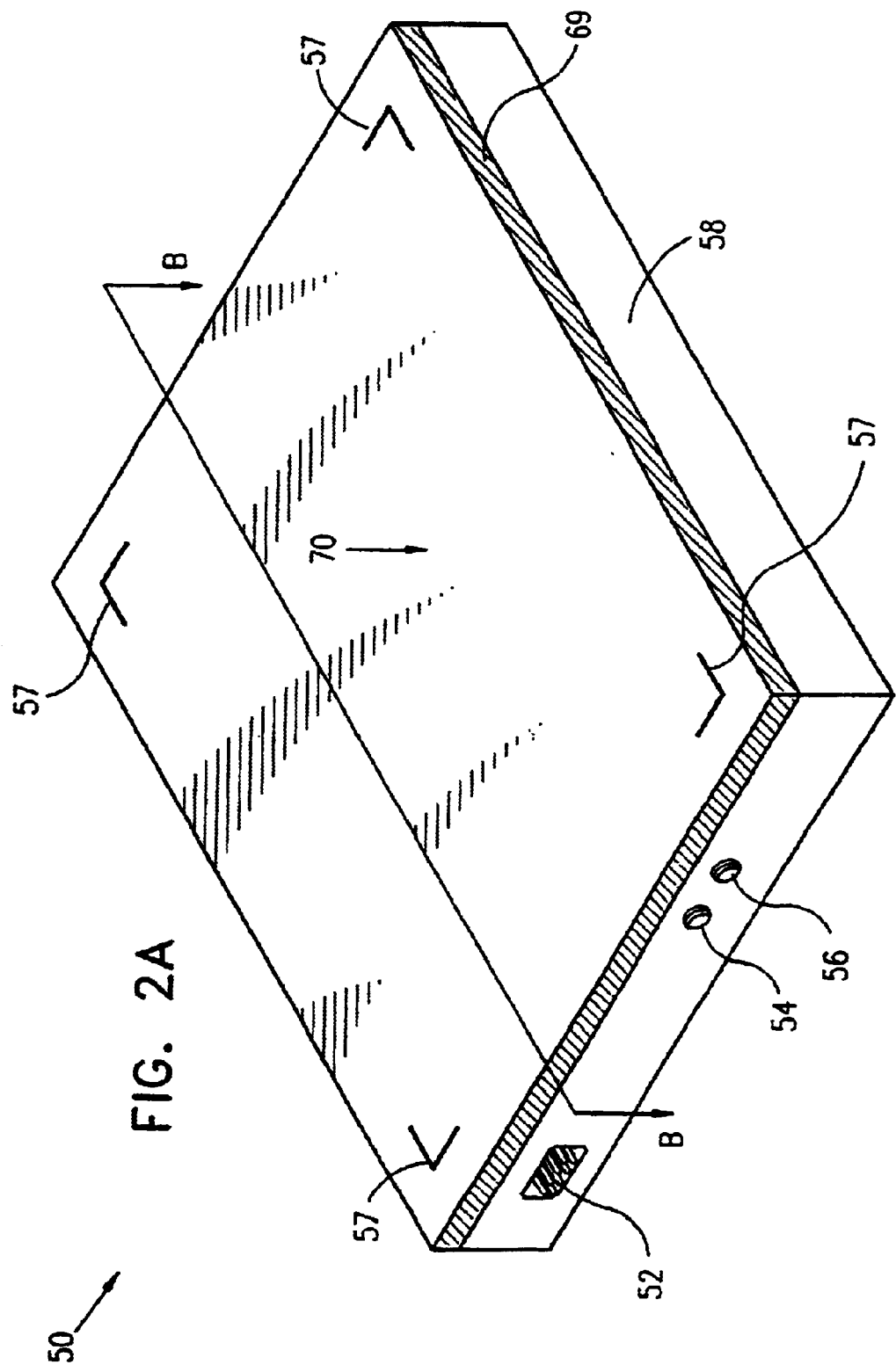
FIGS. 2A and 2B are respective simplified pictorial and sectional illustrations of an image detection module forming part of the system of FIG. 1, FIG. 2B taken over lines B—B of FIG. 2A.
Figure 2B:
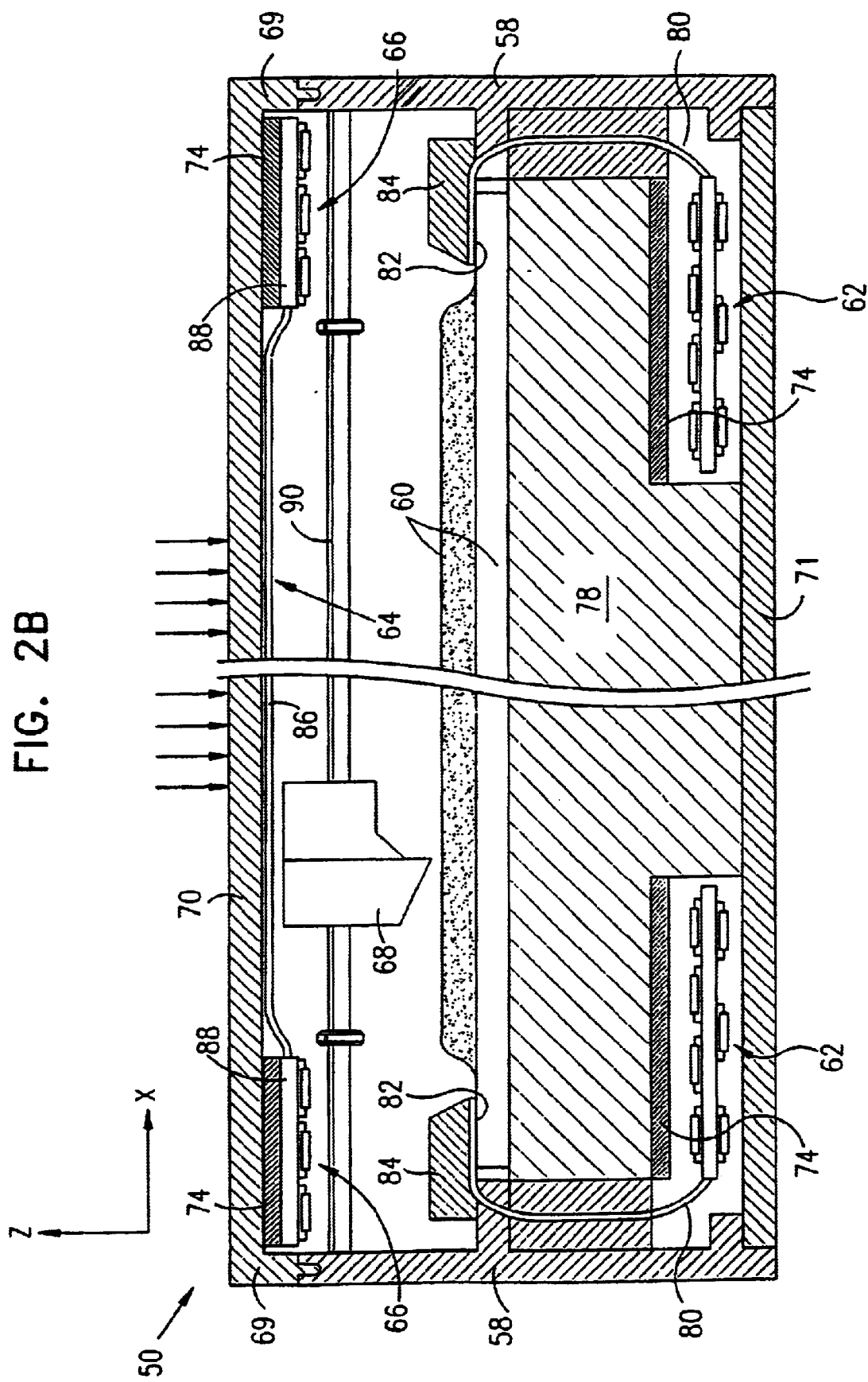

Reference is now made to FIGS. 2A and 2B which illustrate an image detection module 50 which may serve as image detection module 30 of FIG. 1 in accordance with a preferred embodiment of the present invention. Image detection module 50 typically includes a power connector 52, a control communication connector 54 and a high speed data output connector 56 which are connected to power supply cable 33 (FIG. 1), communications link 36 (FIG. 1), and high speed data link 38 (FIG. 1) respectively. Preferably, the imaging area of image detection module 50, indicated in FIG. 2A by reference markings 57, is at least 17"×17". Using an imaging area of this size allows image detection module 50 to be used for a variety of general radiography examinations, without additional mechanical swiveling.

Image detection module 50 preferably includes an outer casing 58 enclosing an X-ray sensor 60 and an apparent surface voltage (ASV) sensor 64 which are respectively associated with integrated radiation data readout electronics 62 and with real-time radiation data readout electronics 66. An elongate scanner 68, control electronics (not shown) and motion drivers (not shown) are also enclosed by outer casing 58.

Casing 58, which is preferably EMI-RFI protected and light shielding, is preferably formed of a lightweight electrically conducting material such as aluminum and may include a removable upper cover 69 and a removable lower cover 71. The casing 58 preferably includes at least one X-ray permeable region 70 and at least one X-ray shielded region 74.

Typically the X-ray permeable region 70 is an integral part of removable upper cover 69 of casing 58 as shown in FIG. 2B. Alternatively, X-ray permeable region 70 may also include a separate element formed of an X-ray permeable material such as carbon fiber and mounted on the upper cover 69.

Integrated radiation data readout electronics 62 and real-time radiation data readout electronics 66 are preferably located in X-ray shielded regions 74 of casing 58 and thus are protected from direct radiation exposure. X-ray shielded regions 74 are preferably formed by inserting highly X-ray absorbent material, such as lead inserts, into casing 58. An internal base 78, which serves as a base upon which X-ray sensor 60 is removably mounted, is preferably located in casing 58 and may be formed as an integral part thereof. X-ray sensor 60 preferably is a multilayer structure as described hereinbelow with particular reference to FIG. 3.

Figure 8:
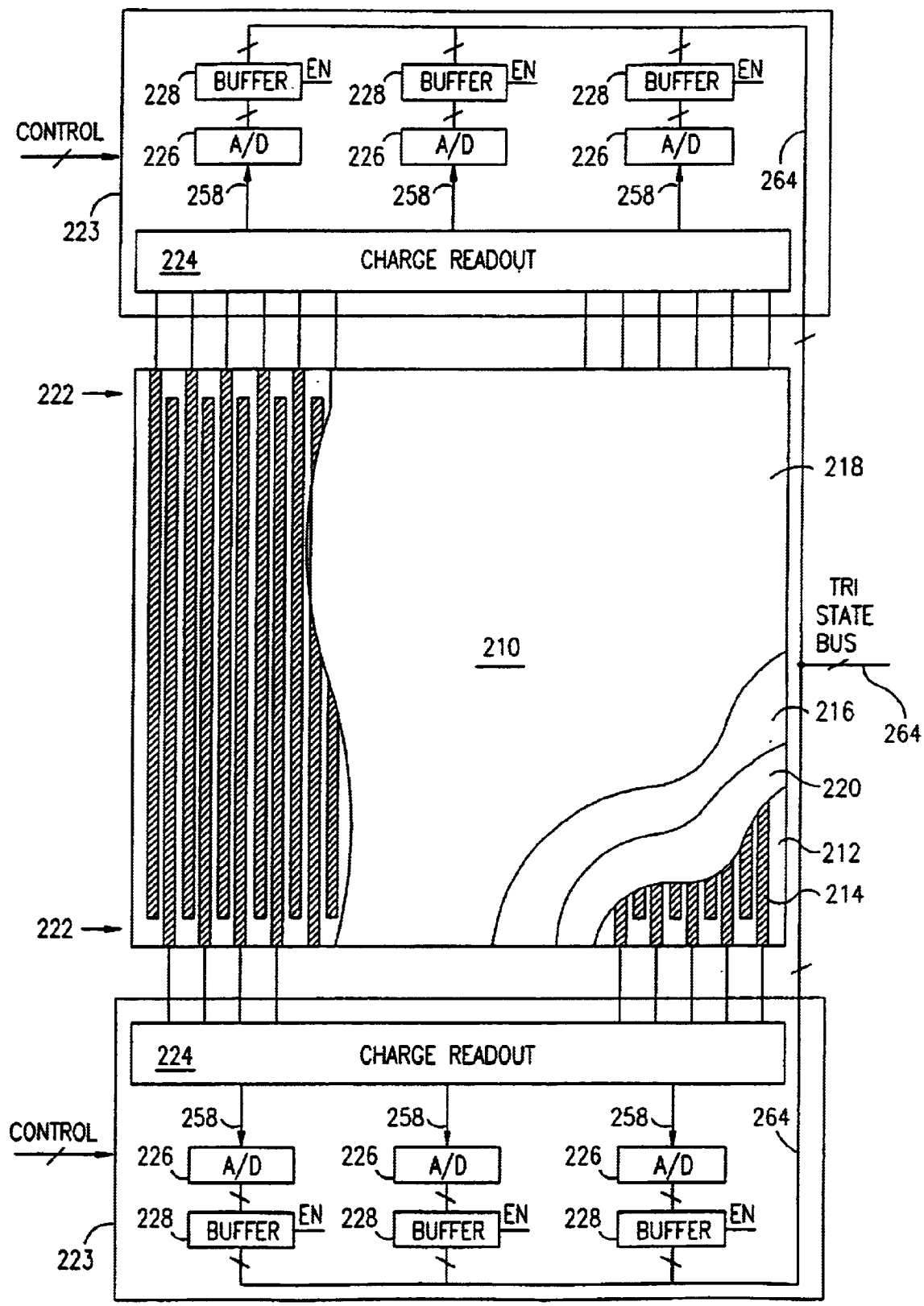
FIG. 8 is a simplified partially cut away, partially pictorial, partially block diagram illustration of an X-ray sensor forming part of the image detection module shown in FIGS. 2A, 2B and 3.
Figure 9:
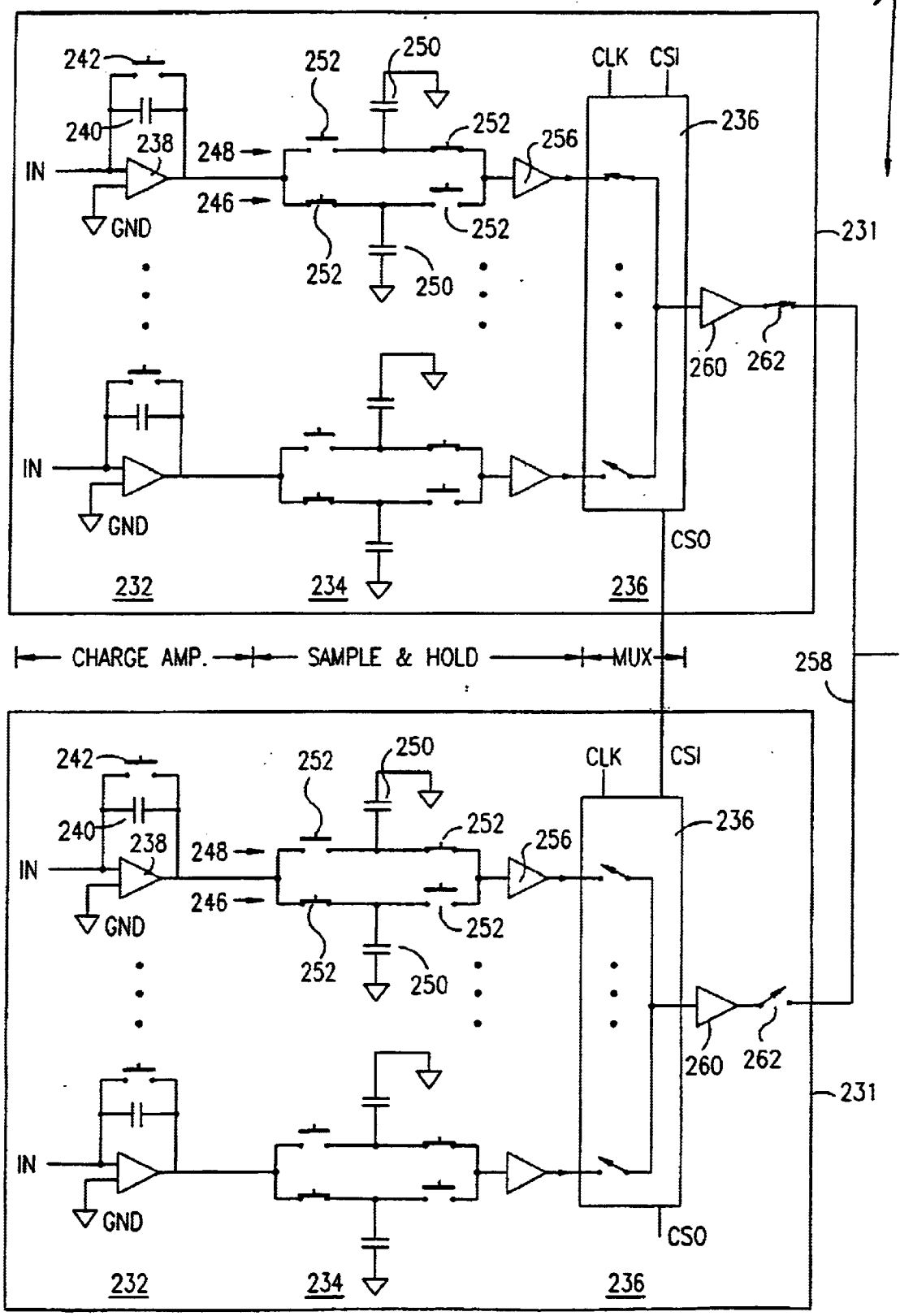
FIG. 9 is a simplified electrical circuit diagram of readout electronics forming part of the image detection module shown in FIGS. 2A, 2B and 3.

Integrated radiation data readout electronics 62 which is preferably operated as described hereinbelow with reference to FIGS. 8–9 is preferably mounted on at least one printed circuit board 80. Printed circuit board 80 preferably includes a flexible interconnect region through which permanent or removable connections are made in register to peripheral, non-active fan-out regions 82 of X-ray sensor 60 using alignment blocks 84. Removable connections, which enable integrated radiation data readout electronics 62 or alternatively X-ray sensor 60 to be removed for servicing or replacement, may be carried out by high density elastomeric zebra connectors or any other suitable connectors. Permanent connections may employ anisotropic electrically conducting adhesive films as known in the art.

ASV sensor 64, which provides a real-time indication of the radiation exposure at X-ray sensor 60, is preferably mounted on an inner surface of upper cover 69 of image detection module 50.

In accordance with a preferred embodiment of the present invention, ASV sensor 64, which overlies and faces X-ray sensor 60, is a multi-layer printed circuit board PCB having a flexible region 86 and at least one rigid region 88 as described hereinbelow with particular reference to FIG. 10. Preferably, the flexible region 86, which includes very thin X-ray permeable layers of polyimide and conductive material, is mounted beneath X-ray permeable region 70. The rigid region 88 of ASV sensor 64, on which real-time radiation data readout electronics 66 is preferably assembled, is preferably mounted beneath X-ray shielded regions 74 of upper cover 69. Alternatively, separate printed circuit boards containing real-time radiation data readout electronics 66 may be connected to the flexible region 86 of ASV sensor 64 using removable or permanent connections. High density elastomeric zebra connectors or other standard high density connectors may be used for removable connections, while permanent connections may employ anisotropic electrically conducting adhesive films as known in the art.

Elongate scanner 68, which preferably includes an elongate charge injector and may further include an elongate light source, is preferably as described hereinbelow with reference to FIG. 4. Typically, elongate scanner 68 is capable of sweeping back and forth over X-ray sensor 60 using conventional electro-mechanical means (not shown) to provide linear motion thereof along conventional linear guides 90.

Figure 3:
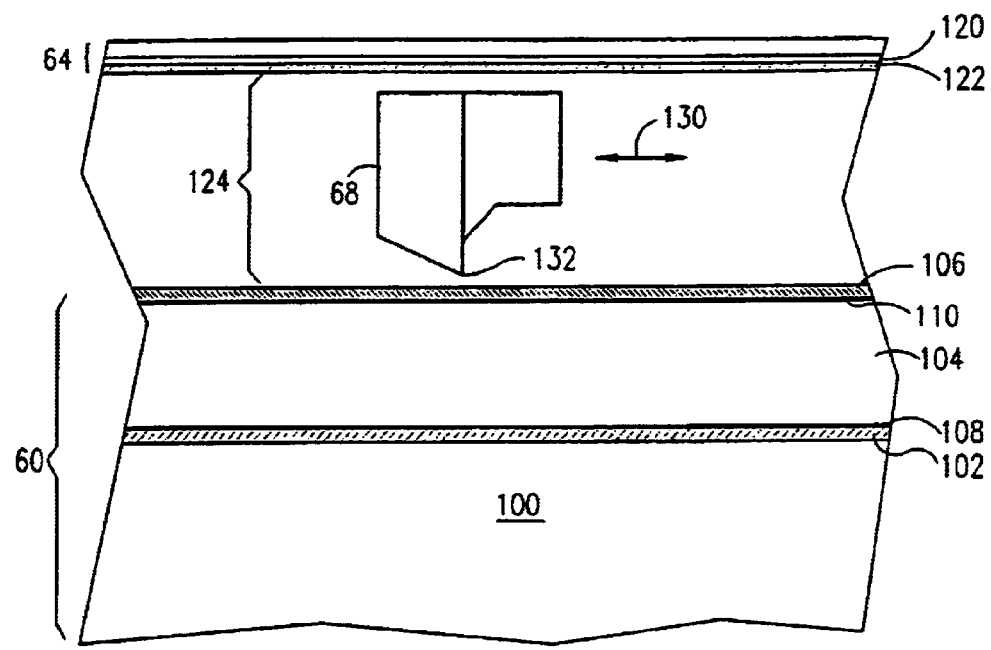
FIG. 3 is an enlarged illustration of part of the sectional illustration of FIG. 2B.

Reference is now made to FIG. 3, which is a cross-sectional view of an active portion of image detection module 50 (FIG. 2B) including X-ray sensor 60, elongate scanner 68, and ASV sensor 64. For the sake of simplicity, image detection module 50 is not shown in its entirety.

X-ray sensor 60 preferably comprises a layered stack including, from bottom to top, a dielectric support substrate 100, a conductive electrode array 102 formed onto and overlying the support substrate 100, a photoelectric conversion layer 104 overlying conductive electrode array 102 and an optical radiation blocking layer 106 overlying the conductive electrode array 102. In accordance with one embodiment of the present invention, a charge buffer layer 108, typically of thickness in the range of less than a micron up to several microns, is disposed at the interface between the photoelectric conversion layer 104 and the underlying conductive electrode array 102.

Support substrate 100 provides mechanical support and dimensional stability for X-ray sensor 60 and may serve as a base upon which layers 102, 108, 104 and 106 are formed. In addition, support substrate 100 provides electrical insulation for conductive electrode array 102. Preferably, support substrate 100 is an electrically insulating panel, typically 1 mm–5 mm thick, having a flat, relatively flawless top surface. Examples of suitable materials for support substrate 100 are Corning glass 7059 and 1737 and Schot Glass AF-45 and Borofloat.

In accordance with alternative embodiments of the present invention, support substrate 100 may be an insulative rigid material, such as alumina, or a metallic substrate having a dielectric coating on its outer surface.

In accordance with a preferred embodiment of the present invention, conductive electrode array 102 comprises a plurality of strip electrodes as shown with reference to strip electrodes 221 in FIG. 8, which are preferably mutually planar, elongate and parallel and which preferably end in fan-out regions as shown in FIG. 2B and FIG. 8.

Conductive electrode array 102 is preferably formed using photolithography and wet or dry etching techniques to pattern and segment a generally continuous conductive film which is deposited on a surface of support substrate 100. Alternatively, thermal ablation techniques such as laser ablation etching can be used for patterning and segmentation of the conductive film.

The conductive film is preferably a thin coating such as indium tin oxide (ITO), aluminum, gold, platinum, chromium, or any suitable conducting material, which is typically deposited on support substrate 100 using conventional vacuum deposition techniques such as sputtering and thermal evaporation to provide a uniform generally pinhole-free layer conducting layer which is typically 1000–10,000 angstroms thick.

The pitch between adjacent strip electrodes 221 (FIG. 8) of conductive electrode array 102 determines the resolution of image detection module 50 in the y-direction. For example, 10–20 lines per millimeter can be achieved by using strip electrodes 221 (FIG. 8) having a pitch of 100–50 microns, respectively. Preferably, the width of each strip electrode 221 (FIG. 8) is at least four times greater than the gap between adjacent electrodes.

Typically, integrated radiation data readout electronics 62 (FIG. 2B) are fixed or removably connected to connection fan-out regions (not shown) of conductive electrode array 102 as described hereinabove.

Photoelectric conversion layer 104, which preferably overlies the thin blocking layer 108 over conductive electrode array 102, preferably exhibits properties which make it suitable to serve as an X-ray imaging material. Following sensitization thereof and exposure to incident radiation, an efficient conversion of X-ray photons to charge carriers occurs in the photoelectric conversion layer 104. The extractable photogenerated free electron hole pairs preferably have high charge carrier mobility and lifetime such that the mean free path of the charge carriers is greater than the desired thickness of photoelectric conversion layer 104. In addition, photoelectric conversion layer 104 preferably exhibits generally high dark resistivity yielding a low dark current, allowing an electric field to be maintained thereacross during X-ray imaging. Furthermore, photoelectric conversion layer 104 is preferably characterized in that the density of charge carrier trap sites therein is low.

Photoelectric conversion layer 104 may be formed of amorphous selenium, selenium alloys, lead iodide, lead oxide, thallium bromide, cadmium zinc telluride, cadmium sulfide, mercury iodide and combinations thereof or any other suitable material that exhibits photoelectric X-ray sensitivity in the radiation spectrum of interest. Typically for medical imaging applications, the X-ray photon energy spectrum ranges from 18 to 150 keV.

It is appreciated that, due to its high dark resistivity, amorphous selenium, which may be doped with arsenic and chlorine, is generally considered the material of choice for photoelectric conversion layer 104. However, it is a particular feature of the present invention that materials having a higher dark current can be tolerated by factoring out a DC component from the integrated radiation data as described in detail hereinbelow.

Preferably, the thickness of photoelectric conversion layer 104 is sufficient to allow absorption of at least 50% of the incident X-ray radiation as further described hereinbelow. For example, when using amorphous selenium or selenium alloys, the layer thickness required to achieve at least 50% absorption ranges from approximately 30 microns (at 18 keV) to 600 microns (at 150 keV). Thus, in accordance with the specific medical imaging application being used, for example mammography or general radiography, the thickness of photoelectric conversion layer 104 may range from 200 microns (mammography) to over 600 microns (general radiography) when amorphous selenium is employed.

Preferably, and depending on the material from which photoelectric conversion layer 104 is formed and depending on the material from which conductive electrode array 102 is formed, the charge buffer layer 108 having unipolar charge blocking characteristics may overlie conductive electrode array 102. The function of the charge buffer layer 108 is to prevent charges of one polarity from being injected from conductive electrode array 102 into sensitized photoelectric conversion layer 104, thus reducing dark current and dark decay, while allowing charges of the opposing polarity to be swept from photoelectric conversion layer 104 and collected at conductive electrode array 102 during exposure.

When photoelectric conversion layer 104 is amorphous selenium, a charge buffer layer 108 having unipolar blocking characteristics may be formed of amorphous arsenic triselenide (a-$As_2Se_3$) by vacuum deposition with a thickness of up to several microns. Alternatively, the charge buffer layer 108 may be a dielectric coating, such as silicon oxide and silicon nitride, of submicron thickness having blocking characteristics for charge carriers of both polarities.

Optical radiation blocking layer 106 is a mono- or multi-layer structure with a thickness of up to several tens of microns. Optical radiation blocking layer 106, which overlies photoelectric conversion layer 104 typically absorbs a wide non-ionizing radiation spectral band, such as undesired soft UV, visible and near infra-red radiation, preventing penetration of said non-ionizing radiation into photoelectric conversion layer 104, while allowing ionizing radiation to pass therethrough.

Alternatively, optical radiation blocking layer 106 may have low pass optical filtering properties thereby blocking a narrower optical radiation spectral band, in order to tailor the optical radiation spectrum which penetrates into photoelectric conversion layer 104. In this case, radiation photons having energy greater than the band gap energy of photoelectric conversion layer 104 are preferably blocked by the optical radiation blocking layer 106. Thus radiation photons, which would cause direct photogeneration of free charge carriers in photoelectric conversion layer 104, are blocked by optical radiation blocking layer 106 and prevented from reaching photoelectric conversion layer 104. By contrast, photons having energy below the band gap energy of photoelectric conversion layer 104 are preferably transmitted through optical radiation blocking layer 106 with relatively low absorption therein. Thus, radiation photons which cause charge excitation from the valence band to energy states below the conductive band, such as trap states, are transmitted through optical radiation blocking layer 106 and therefore are not prevented from interaction with photoelectric conversion layer 104.

For example, when amorphous selenium is used as photoelectric conversion layer 104, the photon cutoff energy of optical radiation blocking layer 106, beyond which photons are highly absorbed and below which photons are weakly absorbed, is preferably around 2 electron-volts. For other photoelectric conversion materials, optical radiation blocking layer 106 may be selected with a different suitable photon cutoff energy.

It is a particular feature of the present invention that the optical spectral filtering characteristics of optical radiation blocking layer 106 are particularly useful in allowing optical radiation employed for trap state occupation across photoelectric conversion layer 104 as described hereinabove. Allowing the optical radiation to be projected directly into photoelectric conversion layer 104 from the same direction as the impingement of the ionizing radiation efficiently reduces ghost effects. The problem of ghosting between successive images is known in the art. By using an optical radiation blocking layer 106 as a radiation blocking layer with photon cutoff energy, the present invention overcomes the known problems of ghosting by employing optical illumination to saturate trap states during sensitization of X-ray sensor 60, thereby reducing ghosting effects during imaging as described hereinbelow with reference to FIG. 11A.

In addition to its optical filtering properties, optical radiation blocking layer 106 generally limits the passage of charges, of at least one polarity therethrough. Optical radiation blocking layer 106 is preferably characterized by a very short charge transit range for charge carriers of at least one polarity thus functioning also as a unipolar or bipolar charge blocking layer. This is typically caused by a high level of charge trapping for charges of at least one charge polarity. The charge transit range for the trapped charge carriers in optical radiation blocking layer 106 can be up to several tens of microns, with the preferred charge transit range being up to several microns at the maximum electrical field created therein during sensitization as described hereinbelow with reference to FIG. 11A.

Preferably when optical radiation blocking layer 106 is a unipolar charge blocking layer, charges of the opposite polarity of those that are blocked by charge buffer layer 108 are blocked and retained as space charges at the surface and/or within the bulk of optical radiation blocking layer 106.

When photoelectric conversion layer 104 is amorphous selenium, optical radiation blocking layer 106 is preferably formed by vacuum deposition of an alkali doped selenium layer, of several microns thickness, to provide a unipolar positive charge blocking layer as well as optical radiation blocking for wavelengths shorter than 600 nanometers. Alternatively, optical radiation blocking layer 106 may be prepared using a dielectric polymer carrier which is loaded with a mix of selected absorbing pigments/dyes to achieve a desired absorption spectral band while maintaining charge transport properties as described hereinabove. When this type of optical radiation blocking layer 106 is employed, the thus prepared optical radiation blocking material is preferably deposited over a passivation layer (not shown) overlying photoelectric conversion layer 104 using conventional coating techniques for organic materials, such as dip coating, spin coating, and spraying.

The passivation layer (not shown) preferably overlies and chemically and/or physically passivates photoelectric conversion layer 104. Examples of a suitable material for passivation layer (not shown) are dielectric polymers such as poly-para-xylylenes which may be applied as a conformal coating in a room-temperature by vacuum deposition as known in the art. Preferably, the combined thickness of passivation layer (not shown) and optical radiation blocking layer 106 is in the range of several microns up to several tens of microns.

In addition to X-ray sensor 60, image detection module 50 comprises ASV sensor 64 which is preferably a multi-layer structure including at least one dielectric support layer 120 and a charge tracking layer 122 as described hereinbelow with reference to FIG. 10.

A space 124, which is preferably occupied by a suitable gas such as air, at at least approximately atmospheric pressure, preferably separates the charge tracking layer 122 of ASV sensor 64 from optical radiation blocking layer 106 of X-ray sensor 60.

As indicated by FIG. 3, elongate scanner 68 sweeps over X-ray sensor 60 along an axis 130 in the x-direction in the space 124 separating ASV sensor 64 from X-ray sensor 60. Sweeps of elongate scanner 68 may be operative to sensitize X-ray sensor 60 and/or to read a charge pattern corresponding to integrated X-ray radiation which impinged upon X-ray sensor 60 as described hereinbelow with particular reference to FIGS. 11A–11D.

In the z-direction, elongate scanner 68 is preferably separated from the top surface of X-ray sensor 60 at a defined distance which is typically selected to leave 0.1 mm–0.3 mm between a wedge 132 of elongate scanner and the top surface of X-ray sensor 60. It is appreciated that, within this range, maintaining a precise distance between wedge 132 of elongate scanner 68 and top surface of X-ray sensor 60 is not critical to the operation of image detection module 50 (FIG. 2).

In order to achieve a fairly compact and generally flat image detection module 50 (FIG. 2), the z-dimension of elongate scanner 68 is preferably fairly small, typically 5–15 mm, with the space 124 sufficient to allow clearance of the elongate scanner 68 during sweeping scans.

Figure 4:
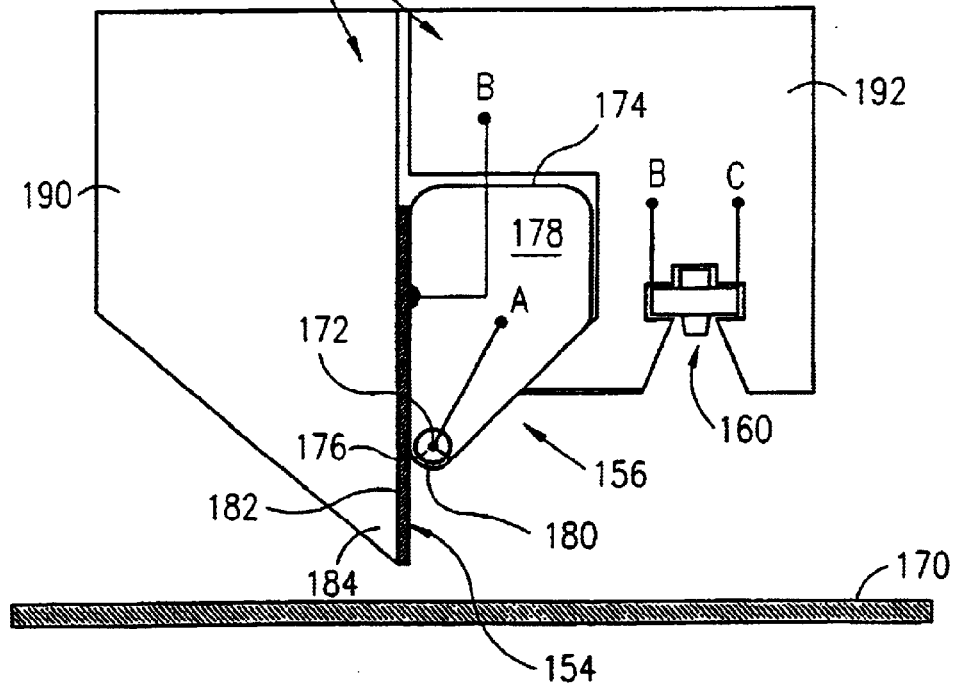
FIG. 4 is a further illustration of part of the sectional illustration of FIG. 2B.

Reference is now made to FIG. 4 which is a sectional illustration of an elongate scanner 150, constructed and operative in accordance with a preferred embodiment of the present invention, which may serve as elongate scanner 68 (FIGS. 2B and 3).

For the sake of simplicity, an X-ray sensor (not shown) which may be identical to X-ray sensor 60 (FIG. 3) is not shown in its entirety in FIG. 4A, and only an optical radiation blocking layer 170 which may be identical to optical radiation blocking layer 106 (FIG. 3) is shown.

Elongate scanner 150 preferably includes an electrically insulating housing assembly 152 and a charge injector 156. In addition, elongate scanner 150 may include an elongate light source 160 which is preferably employed for trap state saturation within photoelectric conversion layer 104 (FIG. 3) of X-ray sensor 60 (FIG. 3) as described herein.

Preferably, charge injector 156 includes an embedded elongate electrode 172, having an external terminal A, and an exposed screen electrode 174, having an external terminal B. Embedded elongate electrode 172 is preferably a thin conductive wire electrode, having a thickness of several hundred microns and having a thin dielectric coating 176, such as glass, typically several tens of microns in thickness. Embedded elongate electrode 172 is preferably mounted onto an elongate dielectric support 178, which is typically a rod formed of glass, alumina or other dielectric ceramic. Exposed screen electrode 174 is preferably formed by winding a thin conductive wire having a thickness of several tens of microns into generally mutually spaced coils over elongate dielectric support 178 and embedded electrode 172.

It is appreciated that alternative configurations for an embedded elongate electrode and elongate screen electrode are possible, it being appreciated that the relationship between and the geometry of embedded elongate electrode, exposed screen electrode and dielectric coating determine the capacitance and therefore the electrical impedance of charge injector 156 which is driven by an AC voltage source.

Charge injector 156 is activated, continuously or in bursts, by applying between terminal A of embedded elongate electrode 172 and terminal B of exposed screen electrode 174 a modulated AC voltage which is typically a floating sine wave with an amplitude on the order of 2000–2,500 volts peak-to-peak and a frequency between several tens of kilohertz to a few megahertz. The AC voltage is selected to produce an AC electric field sufficiently strong to cause discharge in air at exposed regions of dielectric coating 176 where exposed screen electrode 174 intersects embedded elongate electrode. Thus, in accordance with the structure described herein, an elongate discharge site 180 is defined, at which discharge occurs during activation of charge injector 176.

The aforesaid discharge preferably results in the generation of a relatively large quantity of positive and negative charges, with the amount of charge generated generally dependent on the frequency of the AC voltage. A fraction of the generated charge may be injected onto optical radiation blocking layer 170 in the following manner: Charges (positive or negative) are preferably injected from elongate discharge site 180 into optical radiation blocking layer 170 by injection forces created when a bias voltage VB is applied between exposed screen electrode 174 and the conductive electrode array 102 (FIG. 3) of X-ray sensor 60 (FIG. 3) underlying optical radiation blocking layer 170. Typically bias voltage VB is an adjustable and controlled DC voltage in the range of 0–5000 volts.

Preferably, and in order to allow the injection of the thus generated charges into optical radiation blocking layer 170 to be efficiently controlled by bias voltage VB, exposed screen electrode 174 is configured to electrostatically shield embedded elongate electrode 172, having the AC voltage applied thereto, from X-ray sensor 60 (FIG. 3).

Charge injection from charge injector 156 into optical radiation blocking layer 170 is typically self-quenching. Space charges created by the accumulation of charge at optical radiation blocking layer 170 progressively reduce the injection forces to a generally negligible value. Because the injection preferably include charges of both polarities, initial or residual charge at optical radiation blocking layer 170 does not generally influence the final accumulated charge density at X-ray sensor 60 (FIG. 3). Instead, the final accumulated charge density is primarily determined by the polarity and amplitude of bias voltage VB. It is appreciated that the actual amount of charge injected by charge injector 156 at each location of X-ray sensor 60 (FIG. 3) corresponds to the charge density retained thereat prior to charge injection.

Charge injection into optical radiation blocking layer 170 is spatially tailored by an electrostatic barrier 182, which transverses conductive electrode array 102 (FIG. 3) of X-ray sensor 60 (FIG. 3). Electrostatic barrier 182 is preferably formed by deposition a thin conducting coating having a thickness of several microns to several tens of microns along a vertical face of a dielectric wedge 184. Wedge 184, which is typically formed of an electrically insulating material such as glass or ceramic, is preferably an integral part of electrically insulating housing assembly 152. Alternatively, when wedge 184 is formed of ceramic, electrostatic barrier 182 may be formed along a vertical face thereof by co-firing metallization as known in the art. It is appreciated that electrically insulating housing assembly 152 also provides elongate scanner 156 with mechanical stiffness and straightness.

Preferably, electrostatic barrier 182 is in direct electrical contact with exposed screen electrode 176 and is biased to the same bias voltage VB. As a result, the electric field along the electrostatic barrier 182 is tailored such that injected charges arc directed to optical radiation blocking layer 170 along wedge 184, while charge flow at regions of the optical radiation blocking layer 170 beyond electrostatic barrier 182 is generally prevented.

Electrically insulating housing assembly 152 is typically formed of two subassemblies 190 and 192 which are fastened using conventional mechanical means (not shown). When fastened, subassemblies 190 and 192 securely hold and align charge injector 156.

In accordance with one non-limiting embodiment of the present invention, elongate light source 160, which is capable of projecting light onto X-ray sensor 60, is embedded in subassembly 192 of electrically insulating housing assembly 152.

Preferably, elongate light source 160 includes an elongate, linear array of individual light emitting diodes (LEDs) with two external terminals, B and C for electrical power delivery, as described hereinbelow with reference to FIG. 6.

It is a particular feature of a preferred embodiment of the present invention that radiation energy emitted by elongate light source 160 is used to efficiently fill and saturate trap states across photoelectric conversion layer 104 (FIG. 3) as described herein. Accordingly, the emission peak wavelength of the LEDs is selected such that the photon energy associated therewith is lower than the photon cutoff energy for optical radiation blocking layer 170 as described hereinabove. For example, when photoelectric conversion layer 104 (FIG. 3) is amorphous selenium or a selenium alloy, elongate light source 160 preferably emits radiation with a peak wavelength preferably longer than 600 nanometers, such as conventional red LEDs.

Reference is now made to FIG. 5 which illustrates a cross section of one preferred embodiment of elongate light source 160 in accordance with the present invention. As mentioned above, elongate light source 160 preferably includes a plurality of light emitting diode chips (LEDs) 200 which are arranged in an elongate array and are preferably surface mounted to one side of a rigid printed circuit board (PCB) 202. Preferably, a plurality of resistors 204, which control the current flowing through the LEDs 200, and thus LED brightness, are surface mounted on the opposite side of PCB 202.

Preferably, elongate light source 160 is designed to be insertable into subassembly 192 (FIG. 4) of insulating housing assembly 152 (FIG. 4). It is appreciated that the example described herein provides one non-limiting embodiment of elongate light source 160 and that alternative light sources such as an aperture fluorescent elongate lamp may be employed.

Reference is now made to FIG. 6, which illustrates an electrical circuit diagram of elongate light source 160 including an array of LEDs 200 assembled on PCB 202 (FIG. 5). Preferably, LEDs 200 are divided into parallel-connected groups. Within each group, the LEDs 200 are serially connected to one or more current-limiting resistors 204. Preferably, LEDs 200 are driven by a single floating DC voltage source VL, applied between terminals B and C which preferably correspond to terminals B and C of FIG. 4. VL is typically on the order of several tens of volts.

Reference is now made to FIG. 7 which is an electrical diagram of power drivers which drive charge injector 156 and elongate light source 160 of elongate scanner 150 of FIG. 4 in accordance with a preferred embodiment of the present invention. It is appreciated that the charge injector 156 and elongate light source 160 of elongate scanner 150 may be activated individually or concurrently in the following manner:

As mentioned above, charge injector 156 (FIG. 4) is activated, continuously or by bursts by corresponding modulation of the floating AC voltage applied between terminal A of embedded elongate electrode 172 and terminal B of exposed screen electrode 174. Charge injection is driven by bias voltage VB which is applied to terminal B, relative to ground associated with conductive electrode array 102 (FIG. 3) of X-ray sensor 60 (FIG. 3).

As further mentioned above, the elongate light source 160 (FIG. 4) is activated by applying a floating DC voltage, VL, between terminals B and C of elongate light source 160 (FIG. 4).

As shown by FIG. 7, charge injector 156 and elongate light source 160 preferably float on the same high DC bias voltage, VB, applied to terminals B. This eliminates electrical stress between the circuitry of elongate light source 160 and charge injector 156 and also between elongate light source 160 and X-ray sensor 60 (FIG. 3).

Reference is now made to FIG. 8 which is a partially cut away top view schematic illustration of an X-ray sensor 210, constructed and operative in accordance with a preferred embodiment of the present invention. Preferably, X-ray sensor 210 is a multilayer structure similar to that of X-ray sensor 60 described hereinabove with particular reference to FIG. 3. X-ray sensor 210 preferably comprises a layered stack having a dielectric support substrate 212, a conductive electrode array 214, a photoelectric conversion layer 216 and an optical radiation blocking layer 218. X-ray sensor 210 may also include a charge buffer layer 220 disposed between the photoelectric conversion layer 216 and the conductive electrode array 214.

Dielectric support substrate 212, conductive electrode array 214, photoelectric conversion layer 216, optical radiation blocking layer 218 and charge buffer layer 220 are preferably identical to dielectric support substrate 100, conductive electrode array 102, photoelectric conversion layer 104, optical radiation blocking layer 106 and charge buffer layer 108, respectively, all described hereinabove with reference to FIG. 3.

As seen in FIG. 8, conductive electrode array 102 typically includes a plurality of co-planar elongate electrodes 221 ending in fanout regions 222.

Integrated radiation data readout electronics 223, which may serve as integrated radiation data readout electronics 62 (FIG. 2B), is preferably coupled to X-ray sensor 210. Integrated radiation data readout electronics 223 preferably includes charge readout circuitry 224, a plurality of analog to digital converters 226, and data bus buffers 228. Typically, charge readout circuitry 224 comprises a plurality of multi-channel analog, low-noise charge readout ASICs 231 as described hereinbelow with particular reference to FIG. 9. Preferably, the ASICS are mounted on printed circuit board 80 (FIG. 2B) using standard chip-on-board techniques.

Typically, for an X-ray sensor 210 having an imaging area of 17"×17", conductive electrode array 214 comprises about 3600 electrodes 221 (FIG. 8). The number of readout channels of multi-channel charge readout ASICs 231 (FIG. 9) is equal to or greater than the number of conductive electrodes 221 of conductive electrode array 214, with each electrode 221 being connected to a single readout channel. Alternatively, several electrodes 301 may be connected to a single channel, thereby reducing the spatial resolution in one dimension. Therefore, in accordance with this example, charge readout circuitry 224 preferably comprises fifteen multi-channel charge readout ASICs 231 (FIG. 9) each associated with a fanout region 222, each ASIC 231 (FIG. 9) including 120 readout channels.

In accordance with a preferred embodiment of the present invention, connections between electrodes 221 and charge readout circuitry 224 are carried out at two fanout regions 222 located at opposing, non-active, peripheral regions of X-ray sensor 210. Preferably, half of the electrodes 221 are connected through the first fanout region and the remaining half are connected through the second fanout region such that adjacent electrodes are connected to opposing fanout regions. In this manner, the density of connections at each fanout regions is reduced. Conventional connection technologies such as those mentioned hereinabove may thus be used to provide removable or permanent electrical connection between X-ray sensor 210 and integrated radiation data readout electronics 223.

It is appreciated that, with the exception of the ASICS 231 (FIG. 9), the components of integrated radiation data readout electronics 223 are typically mounted on PCB 80 (FIG. 2B) using SMT techniques as known in the art.

Reference is now made to FIG. 9, which illustrates the charge readout circuitry 224 of FIG. 8 in accordance with a preferred, non-limiting, embodiment of the present invention.

As noted above, the charge readout circuitry 224 preferably includes a plurality of multi-channel readout ASICs 231. Each multi-channel charge readout ASIC 231 preferably comprises three primary stages: a charge amplifier stage 232, a sample and hold stage 234, and a multiplexer 236.

For each readout channel, the charge amplifier stage 232 comprises a low-noise, frequency band-width limited, bi-directional charge integrator 238, associated with a feedback capacitor 240, to define a charge amplifier gain, and a solid-state reset switch 242 to periodically reset the charge integrator 238. Feedback capacitor 240 can be selected to provide a suitable gain in accordance with the specific parameters of the X-ray sensor 210 (FIG. 8).

The charge amplifier stage 232 typically receives a bi-directional flow of charges from electrodes 221 (FIG. 8) and provides corresponding positive or negative output voltage values, each output voltage value representing the accumulated charge at a single charge integrator 238 between consecutive resets by reset switch 242. Output voltage values from the charge amplifier stage 232 are sampled by sample and hold stage 234, each readout channel corresponding to a synchronized dual sample and hold circuit 244. Synchronized dual sample and hold circuit 244, which provides generally continuous sampling, typically includes two sub-circuits 246 and 248, each of which preferably contains a capacitor 250 and two solid state switches 252.

During readout, one of the two sub-circuits 246 and 248 samples a value from charge amplifier stage 232 while the other holds a previously sampled value to provide the held value to be sampled by the multiplexer 236 through a buffer 256.

At predetermined time intervals, in accordance with the read sampling frequency which determines the width of each raster line of the image being read, the functions of sub-circuits 246 and 248 are interchanged between sampling and holding by solid state switches 252 in preparation for readout of a new raster line. Immediately after interchange, charge integrator 238 is instantaneously reset via reset switch 242 also causing reset of the sub-circuit 246 or 248, which is in a sampling mode, thereby integration and sampling is associated only with charge from the raster line being read.

In FIG. 9, as indicated by the states of solid state switches 252, sub-circuit 246 is shown as sampling the output of charge integrator 238, after a reset has been completed, while sub-circuit 248 is shown as holding a previously sampled value to be sampled by multiplexer 236 through buffer 256.

It is appreciated that generally uninterrupted continuous sampling, as implemented by sample and bold circuitry 234 or by any other suitable circuitry, is of particular importance when the charge injector 156 (FIG. 4) of elongate scanner 150 (FIG. 4) is continuously activated as described hereinabove.

Multiplexer 236 provides a parallel-to-serial conversion of the integrated analog data from the readout channels by sequentially addressing each buffer 256 at a rate determined by the frequency of a clock CLK supplied by a controller (not shown). Typically, with each CLK pulse, the analog output of a subsequent buffer 256 is provided to a common output line 258 through buffer 260. The common output line 258 is preferably shared by a group of cascaded multi-channel charge readout ASICs 231, thereby providing a common output line for the group of cascaded multi-channel charge readout ASICs 231. Each common output line 258 corresponds to a single cascade.

Signals CSI and CSO are used to provide cascade functionality to the multi-channel charge readout ASICs 231. Each multi-channel charge readout ASIC 231 is selected by a chip select input signal CSI, which doses switch 262 to allow transfer of held analog data from buffers 256 to common output line 258. When the last buffer 256 has transferred its analog data to output line 258, a chip select output signal CSO is provided by the multiplexer 236 of multi channel charge readout ASIC 231. CSO causes switch 262 to be disconnected and provides a CSI signal for the next multi-channel charge readout ASIC 231 in the cascade. Through ASIC cascading, it is appreciated that a group of ASICs performs as a single expanded ASIC.

It is appreciated that data representing a raster line is sampled in parallel at all electrodes 221 (FIG. 8) by all cascades of multi-channel charge readout ASICs 231, each cascade associated with a single output line. During the time required for parallel sampling of one raster line of charge data, the hold data of all buffers 256, representing a previously sampled raster line of charge data, is serially output concurrently along output lines 258 of the cascades.

Referring back to FIG. 8, each output line 258 is associated with a corresponding A/D convener 226 which provides an analog to digital conversion. The A/D conversion typically has a resolution of between 14 and 8 bits, depending on whether a tone scale remapping function is employed during readout, as described hereinbelow with reference to FIG. 13. Output digital signals are transferred from all A/D converters 226 to a common data bus output 264 through data bus buffers 228, each data bus buffer 228 preferably comprising tri-state outputs.

During readout of integrated data from X-ray sensor 210, digital data is serially transferred concurrently from all A/D converters 226 to corresponding data bus buffers 228 at a first transfer rate. Data from all data bus buffers 228 is serially transferred to the common output data bus 264 at a second transfer rate using Enable signals EN, supplied by a controller (not shown), to sequentially address each data bus buffer 228 thereby to enable data output therefrom. Typically, the second transfer rate is significantly higher than the first transfer rate. Thus the analog-to-digital conversion may be performed at a relatively low rate, simplifying integrated data readout circuitry 222 and reducing the cost of A/D converters 226.

It is appreciated that the sequence of data transfer from the various data bus buffers 228 is selected in order to provide proper reconstruction of raster lines being read, in accordance with the structure of fanout regions 222 and the order in which electrodes 221 are electrically connected to charge readout circuitry 224.

It is further appreciated that the digital data output on data bus 264 provides a digital representation of spatially modulated X-ray integrated radiation impinging on X-ray sensor 210 corresponding to an object being imaged.

Reference is now made to FIG. 10 which is a partially cut away bottom view schematic illustration of an ASV sensor 270 which may serve as ASV sensor 64 (FIG. 2B), constructed and operative in accordance with a preferred embodiment of the present invention. ASV sensor 270 is preferably a multi-layer printed circuit board, having a flexible region 272 and a rigid region 274 which may serve as flexible region 86 and rigid region 88, respectively, in the embodiment of FIG. 2B.

The flexible region 272 is preferably a thin, X-ray permeable polyimide-based multi-layer PCB having, in downstream to upstream order with respect to the direction of X-ray impingement: a charge tracking layer 276, a dielectric layer 278, a fanout layer 280, and a dielectric support layer 282. Both charge tracking layer 276 and fanout layer 280 are preferably very thin patterned conducting layers, each having a thickness of several microns so as to be X-ray permeable. It is appreciated that the ASV sensor 270 is oriented within an image detection module such as image detection module 50 (FIG. 2B) such that the charge tracking layer 276 faces X-ray sensor 60 (FIG. 2B).

Charge tracking layer 276 is preferably a gold-coated copper layer, formed by conventional PCB manufacturing technologies to provide an array of generally coplanar discrete plate electrodes 274, preferably arranged in X rows and Y columns. The structure of plate electrodes 274 determines the sensing apertures of the ASV sensor 270. Preferably, plate electrodes 274 are square having dimensions in the range of several millimeters by several millimeters to tens of millimeters by tens of millimeters, in accordance with the desired resolution of ASV sensor 270 as described hereinbelow. It is appreciated that plate electrodes 274 with other geometries or dimensions may be employed.

Each plate electrode 274 is preferably associated with a dedicated output line 283. During exposure to X-ray, real-time radiation data, in the form of charges, flows from each individual plate electrode 274 to a corresponding individual channel of real-time radiation data readout electronics 278 via corresponding output lines 283.

Output lines 283 are preferably routed in fanout layer 280, which is generally electrostatically shielded from X-ray sensor 60 (FIG. 2), by charge tracking layer 276, thereby reducing cross-talk between signals of the ASV sensor 270. Alternatively, output lines 283 may be formed as part of charge tracking layer 272, the routing of the output lines 283 ensuring that the area occupied thereby is significantly smaller than the area of plate electrodes 274, in order to reduce signal cross-talk. When output lines 283 are formed as part of charge tracking layer 272, the need for fanout layer 280 is obviated.

In accordance with an alternative embodiment of the preferred invention, charge tracking layer 276 may comprise a relatively small number of large-area, fixed shape plate electrodes which serve as regional sensors having sensing apertures similar to those of ion chamber conventional automatic exposure control devices. It is appreciated that information sensed by the ASV sensor in this case is not imagewise but instead is analogous to that sensed by regional density sensors and may include several distinctly readable fields. The advantage of the approach described herein is that the ASV sensor forms a simple integral component of image detection module 50 (FIG. 3).

In addition to the thin multi-layer of the flexible region 272, the rigid region 274 preferably also comprises a glass fiber epoxy laminate such as FR4. The rigid region 274 is preferably a substrate on which real-time radiation data readout electronics 284 is mounted using chip-on-board techniques and/or SMT as is known in the art. Fanout layer 280, which extends over the flexible region 272 and the rigid region 274, provides electrical interconnections between plate electrodes 274 and real-time radiation data readout electronics 284 through via holes (not shown) as known in the art.

Real-time radiation data readout electronics 284 preferably includes charge readout circuitry 286, analog to digital (A/D) converters 288 and data bus buffers 290. It is appreciated that the functionality of real-time radiation data readout electronics 284, namely reading out of data in the form of flowing charges, is similar to the functionality of integrated radiation data readout electronics 223 (FIG. 8). Thus, charge readout circuitry 286, analog to digital (A/D) converters 288 and data bus buffers 290 are typically identical to charge readout circuitry 224, analog to digital (A/D) converters 226 and data bus buffers 290 respectively described with respect to FIG. 8. However, since the amplitudes of currents flowing to real-time radiation data readout electronics 284 may be different than the amplitudes of currents flowing to integrated radiation data readout electronics 223 (FIG. 8), the embodiment of FIG. 10 preferably uses charge integrators (not shown) that may have gains different from those of charge integrators 238 (FIG. 9). It is appreciated that the sampling time between two subsequent resets of the real-time radiation data electronics 284 determines the time required to readout an entire frame of data from all plate electrodes 274 in parallel.

It is appreciated that the number of input channels of charge readout circuitry 286 preferably corresponds to the number of plate electrodes 274. The number of plate electrodes 274 is preferably in the range of hundreds to several thousand. It is appreciated that increasing the number of plate electrodes 274 provides increased spatial resolution of ASV sensor 270 and higher resolution imagewise data. The precise number of plate electrodes 274 is selected in accordance with a tradeoff between the number of plate electrodes 274 required to provide generally imagewise real-time radiation information, which is preferably large, and the number of plate electrodes 274 required for real-time data processing, which is preferably small.

In accordance with a real-time processing algorithm described hereinbelow for detecting the borders of an irradiated field across X-ray sensor 60 (FIG. 3), a global group 294 of plate electrodes 294 included within borders of the irradiated field may be defined. Alternatively or additionally, regional groups 296 of plate electrodes 274 may be defined in accordance with the algorithm described hereinbelow with respect to FIG. 13.

Readout of real-time radiation data by charge integration provides real-time exposure data which is used for real-time dose control. Dose control allows optimization for each examination, thereby eliminating inaccuracies resulting from imperfect registration and patient alignment relative to an automatic exposure control device in prior art methodologies. Moreover, instead of using prior art fixed aperture and fixed location density sensors typically associated with prior art phototimers and other exposure control devices, the present invention provides generally imagewise real-time exposure data which enables real-time image contrast feedback to be employed for dose optimization as described hereinbelow. The present invention may thus enable a lowering of the dose required to reach desired diagnostic contrasts for a variety of different types of examination.

Apparent surface voltages of an X-ray sensor 60 (FIG. 3) or of X-ray sensor 210 (FIG. 8), which correspond to the amount of radiation absorbed thereby, arm detected by ASV sensor 270 in real-time during exposure to X-ray radiation in the following manner ASV sensor 270 is biased to a ground potential via real-time radiation data readout electronics 284. Due to the electrostatic conditions in the space 124 (FIG. 3) between X-ray sensor 60 (FIG. 3) and ASV sensor 270, as described hereinbelow with particular reference to FIG. 11A, the charge redistribution in charge to tracking layer 272 generally tracks and corresponds to the net charge pattern generated at X-ray sensor 60 (FIG. 3) during exposure. Charge redistribution in charge tracking layer 272 causes measurable currents to flow in real-time radiation readout electronics 284, thereby providing signal representation of apparent surface voltages of X-ray sensor 60 (FIG. 3).

The spatial resolution of the charge tracking is a function of the space 124 (FIG. 3) separating the ASV sensor 270 from X-ray sensor 60 (FIG. 3) and the strength of the electric field thereacross. The spatial resolution of ASV sensor 270 is limited by the spatial resolution of the charge tracking, with the actual resolution being determined by the dimensions and quantity of plate electrodes 274.

It is appreciated that in the embodiment shown in FIG. 10, ASV sensor 270 comprises a single multilayer PCB. However, and in accordance with the size of the image detection module 50 (FIG. 2B) in which ASV sensor 270 is incorporated, the ASV sensor 270 may in fact comprise several multilayer PCB's each comprising flexible regions 272 and rigid regions 274 tiled to create an expanded flexible region 272 to providing a larger sensing area for the ASV sensor 270.

It is further appreciated that an ASV sensor similar in structure to ASV sensor 270 may be useful in sensing apparent surface voltages for other detector systems or purposes where real-time indication of the apparent surface voltages provides useful system feedback.

Reference is now to made to FIGS. 11A–11D which illustrate the operation of an image detection module 320 constructed and operative in accordance with a preferred embodiment of the present invention. Image detection module 320 may serve as image detection module 30 in the embodiment of FIG. 1 or as image detection module 50 in the embodiment of FIG. 2B.

Image detection module 320 preferably includes a casing (not shown), enclosing an X-ray sensor 322 coupled to integrated radiation data readout electronics 324, an ASV sensor 326 (FIG. 11B) coupled to real-time radiation data readout electronics 328 (FIG. 11B), an elongate scanner 330, control electronics (not shown), motion drivers (not shown) and electrical power drivers as described hereinabove. The casing (not shown) of image detection module 320 is preferably identical to casing 58 (FIG. 2B).

A space 331 (FIG. 11B), which is filled with a gas such as air at preferably atmospheric pressure, separates ASV sensor 326 (FIG. 11B) and X-ray sensor 322. X-ray sensor 322 preferably comprises a layered stack as described hereinabove with particular reference to FIG. 3, including, from bottom to top, a dielectric support substrate 100 (FIG. 3) not shown in FIGS. 11A–11D, a conductive electrode array 332, a photoelectric conversion layer 334 and an overlying optical radiation blocking layer 336. In accordance with one embodiment of the present invention, a unipolar or bi-polar charge buffer layer 108 (FIG. 3) not shown in FIGS. 11A–11D, is disposed at the interface between the photoelectric conversion layer 334 and the underlying conductive electrode array 332.

The conductive electrode array 332, photoelectric conversion layer 334 and optical radiation blocking layer 336 are preferably identical to conductive electrode array 102 (FIG. 3), photoelectric conversion layer 104 (FIG. 3) and optical radiation blocking layer 106 (FIG. 3), respectively.

For the purpose of the discussion which follows, conductive electrode array 332 can be considered, electrostatically, as being a continuous electrode, inasmuch as the gaps between the strip electrodes thereof are typically below the overall operating resolution of image detection module 320.

Integrated radiation data readout electronics 324 (FIG. 11C), which is employed to read-out integrated radiation data in the form of charges after exposure, is preferably as described herein with particular reference to FIG. 8.

ASV sensor 326 is preferably identical to that described herein with reference to ASV sensor 64 (FIG. 3) or ASV sensor 270 (FIG. 10), faces X-ray sensor 322. For the purpose of the discussion which follows, only a charge tracking layer 337 of the ASV sensor 326 is shown. Preferably, charge tracking layer 337 is biased to a ground potential via real-time radiation data readout electronics 328.

Real-time radiation data readout electronics 328, which is preferably employed to read out real-time exposure data, is identical to that described herein with particular reference to FIG. 10

Elongate scanner 330, which preferably comprises a charge injector 338 having an elongate electrostatic barrier 340, may further comprise an elongate light source 342. Elongate scanner 330 is preferably identical to that described hereinabove with reference to elongate scanner 150 (FIG. 4). Conventional electro-mechanical means are preferably employed to drive the motion of elongate scanner 330 back and forth over X-ray sensor 322 along the X-axis.

Figure 11A:
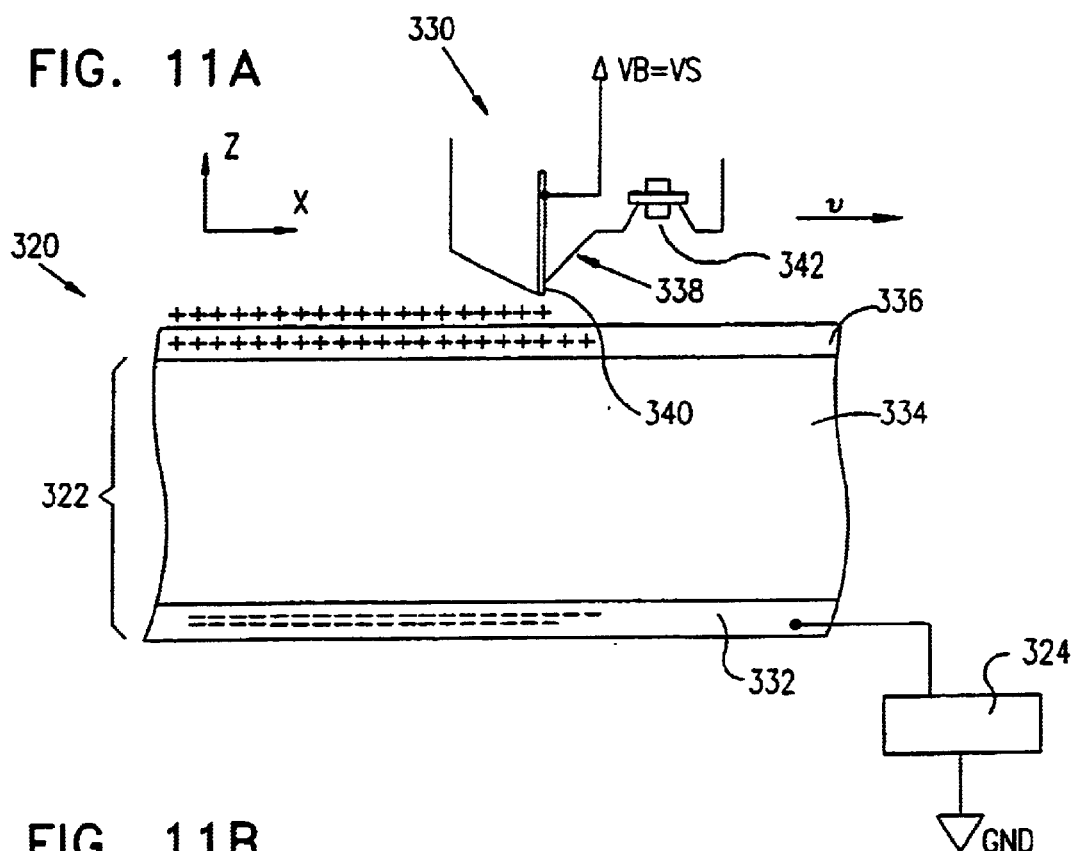
FIGS. 11A, 11B, 11C and 11D are simplified illustrations useful in understanding the operation of the image detection module shown in FIGS. 2A, 2B, and 3.
Figure 11B:
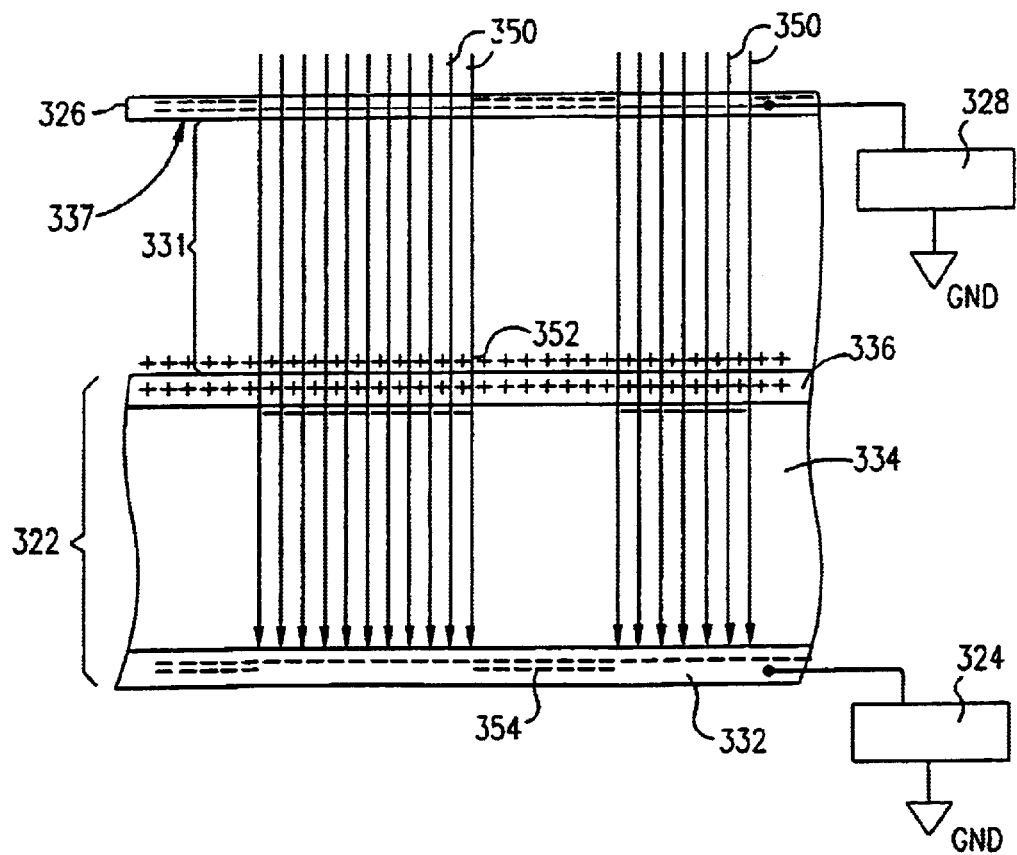
Figure 11C:
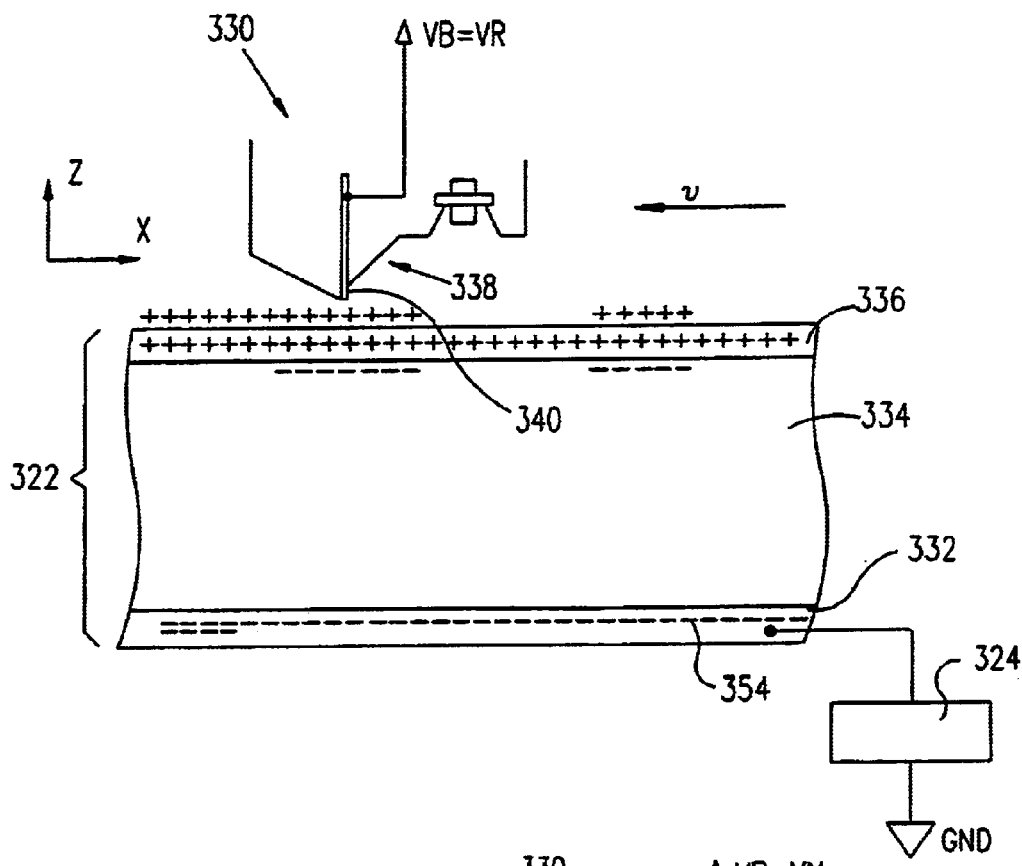
Figure 11D:
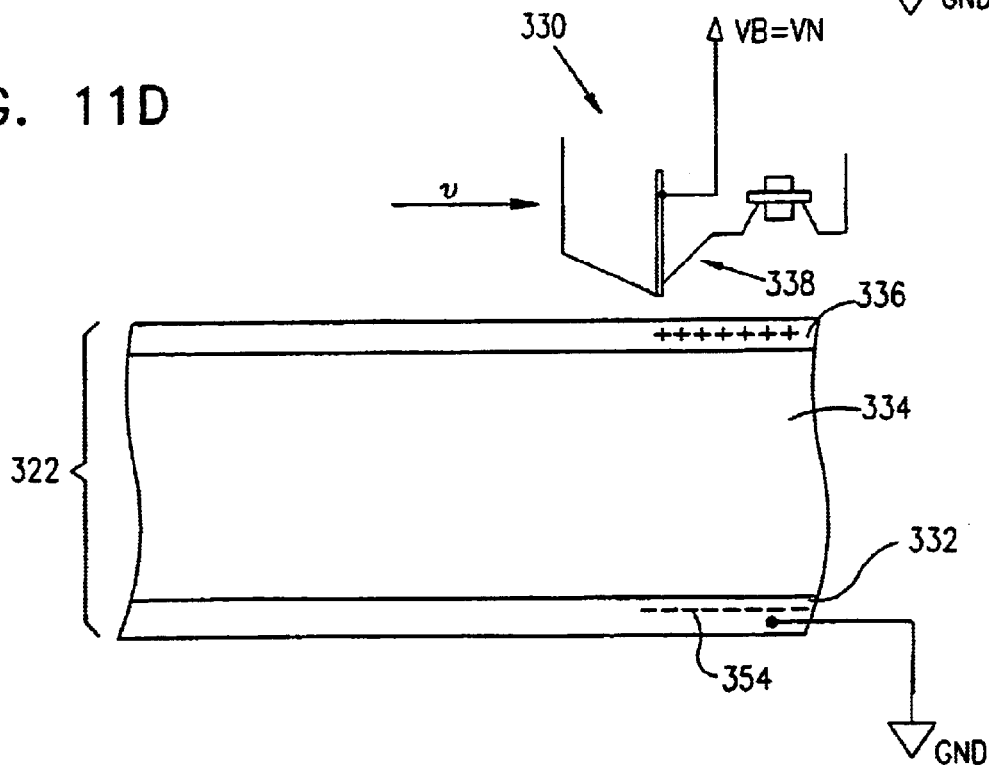
Figure 12:
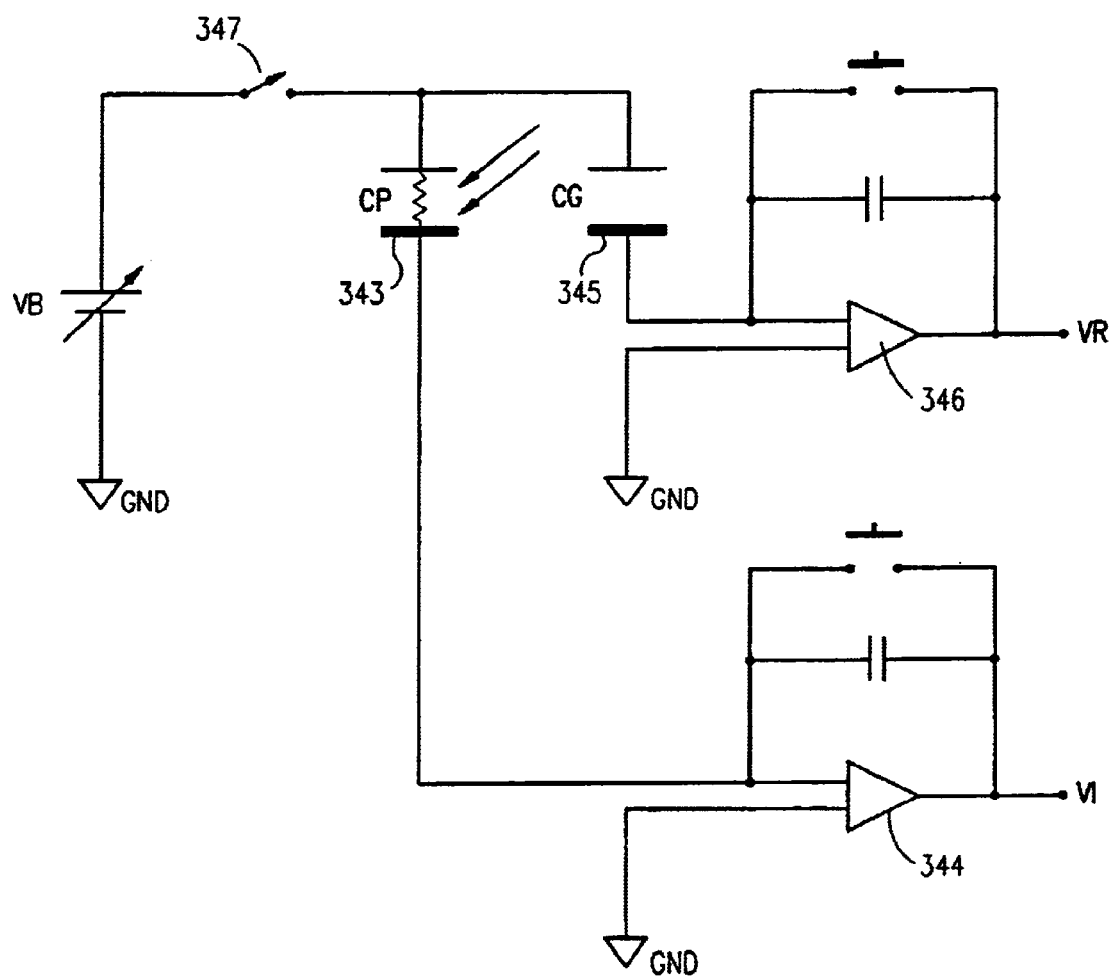
FIG. 12 is a block diagram illustrating the steps of an algorithm for processing imagewise real-time exposure data in accordance with a preferred embodiment of the present invention.

Reference is now made to FIG. 12 which is a schematic circuit diagram showing a simplified electrical equivalent of the image detection module 320 of FIGS. 11A–11D, useful in understanding the present invention.

A capacitor CP indicates a specific capacitance of X-ray sensor 322 (FIG. 11A), while a capacitor CG indicates a specific capacitance of ASV sensor 326 (FIG. 11B), that is the capacitance created between charge tracking layer 337 (FIG. 11B) and optical radiation blocking layer 336 (FIG. 11B) through associated space 331 (FIG. 11B).

As seen in FIG. 12, an electrode 343 of capacitor CP representing a single electrode 221 (FIG. 8) of conductive electrode array 332 (FIG. 11A) is electrically coupled to a charge integrator 344, representing a single channel, of integrated radiation data readout electronics 324 (FIG. 11A). An electrode 345 of capacitor CG, representing a single plate electrode 274 (FIG. 10) of charge tracking layer 337 (FIG. 11B), is electrically coupled to a charge integrator 346 representing a single channel of real-time radiation data readout electronics 328 (FIG. 11B). Capacitors CP and CG are connected in parallel through the ground of charge integrators 344 and 346.

Adjustable bias potential VB represents the bias voltage applied to a screen electrode and electrostatic barrier of charge injector 338 (FIG. 11A) as described hereinabove with reference to FIG. 4. A switch 347 is an electrical equivalent representing the effect of activation of charge injector 338 (FIG. 11A).

Referring back to FIG. 11A, the sensitization of X-ray sensor 322 preferably occurs in the following manner:

Prior to a sweep of elongate scanner 330, the bias voltage VB is adjusted to a sensitizing bias value VS. The sensitizing bias voltage VS is applied to the exposed screen electrode 174 (FIG. 4) of charge injector 338 and to electrostatic barrier 340 relative to a ground potential GND associated with conductive electrode array 332 through integrated radiation data readout electronics 324.

While sensitizing bias voltage VS is applied thereto, elongate scanner 330 sweeps across X-ray sensor 322, and the charge injector 338 is activated. During the sweep, self-quenching charge injection from charge injector 338 causes X-ray sensor 322 to be charged to an apparent surface voltage (ASV) which corresponds to the sensitizing bias voltage VS. Self-quenched charge injection is described hereinabove with particular reference to FIG. 4.

Preferably, when the photoelectric conversion layer 334 is amorphous selenium or a selenium-based alloy, sensitizing bias voltage VS is preferably positive, yielding a distribution of positive charges at optical radiation blocking layer 336 which distribution is generally uniform as shown in FIG. 11A. Since voltage VS is positive in accordance with this example, optical radiation blocking layer 336 preferably has a short transit range for charges of positive polarity and may, in accordance with one embodiment of the present invention, also have a short transit range for negative polarity charges. As a result of the short transit range for positive charges, following sensitization, positive charges are typically trapped on the surface of and/or within optical radiation blocking layer 336, and/or at the interface between optical radiation blocking layer 336 and photoelectric conversion layer 334. Trapped charges at optical radiation blocking layer 336 cause a uniform electric field to be created across photoelectric conversion layer 334.

Typically, the value of sensitizing voltage VS, which is selected in order to create a high, but sustainable, electric field across photoelectric conversion layer 334, is on the order of several hundred to several thousand volts, with the exact value depending on the thickness of photoelectric conversion layer 334. If photoelectric conversion layer 334 is amorphous selenium or a selenium-based alloy, the desired field strength is typically in the range of 5–20 volts/micron, and preferably is 10 volts/micron corresponding to a VS value of several thousands of volts.

Creation of an electric field within photoelectric conversion layer 334 causes sensitization of the material in preparation for exposure to X-ray radiation, with a higher field strength providing increased sensitivity to X-ray radiation. Sensitization is typically carried out immediately after a PREPARE trigger is received by image detection module 320. The PREPARE trigger may be a result of a technologist pressing a manual prepare switch, such as those employed with conventional X-ray systems, prior to initiation of X-ray exposure.

Concurrent with activation of charge injector 338 and during the sweep of elongate scanner 330 over X-ray sensor 322, elongate light source 342 may be activated causing optical radiation to be emitted by elongate light source 342 and projected through optical radiation blocking layer 336 into photoelectric conversion layer 334. The emitted optical radiation is employed to excite charge carriers from the valence band to occupy most of the trap states distributed across photoelectric conversion layer 334 as described hereinabove. The trap states are thus saturated prior to X-ray radiation exposure.

It is a particular feature of the present invention that radiation photons, whether from the elongate light source 342 or the charge injector 338 or any other optical radiation source, having photon energy above the band gap of photoelectric conversion layer 334 are preferably absorbed in optical radiation blocking layer 336 and thus blocked from reaching photoelectric conversion layer 334. This filtration prevents undesirable direct photo-generation of free charge carriers, and associated dark decay, within photoelectric conversion layer 334 during the sensitization.

The charge tracking layer 337 (FIG. 11B) is biased to ground via real-time radiation data electronics 328. Thus a uniform electric field is created in space 331 (FIG. 11B) when X-ray sensor 320 is charged to an apparent surface voltage (ASV) corresponding to sensitizing voltage VS, and a uniform charge distribution is created in the charge tracking layer 337. In the electrical circuit equivalent of FIG. 12, completion of sensitization is represented by closing switch 347 and charging capacitors CP and CG to a value of VB=VS.

Turning now to consideration of FIG. 11B, it is seen that FIG. 11B illustrates exposure of image detection module 322 to spatially modulated X-ray imaging radiation 350. During exposure to X-ray radiation, elongate scanner 330 is stationary, overlying non-active regions of X-ray sensor 322, which may be regions which are shielded from X-ray radiation as described hereinabove thus the elongate light source 342 and charge injector 338 are not typically directly exposed to X-ray radiation. Accordingly, elongate scanner 330 is not illustrated in FIG. 11B.

X-ray imaging radiation 350 is generally absorbed by photoelectric conversion layer 334, with the absorbed radiation constituting a transmission modulated X-ray image of an object, such as a region of the human body.

X-ray photons, which are by nature much more energetic than the band gap of the photoelectric conversion layer 334, create free electron/hole pairs in photoelectric conversion layer 334 in accordance with the spatially modulated pattern of the impinging radiation. The electric field present across photoelectric conversion layer 334, causes the electron/hole pairs which survive recombination to separate as free charge carriers of opposite polarities which transit in opposing directions along electric field lines which are perpendicular to the plane of photoelectric conversion layer 334.

In the example shown in FIGS. 11A–11D, positive charges are retained at optical radiation blocking layer 336 during sensitization. Thus, following exposure and corresponding generation of free charge carrier pairs in photoelectric conversion layer 334, negative charge carriers move towards optical radiation blocking layer 336. This causes imagewise reduction of the positive net charge at the top of photoelectric conversion layer 334 thereby creating a net charge pattern 352, which corresponds to the spatially modulated X-ray imaging radiation 350.

X-ray exposure and creation of the net charge pattern 352, yields patterning of the previously uniform ASV at X-ray sensor 322. Thus, the electric field extending normal to photoelectric conversion layer 336 is no longer uniform. Instead the normal electric field is weakened and reduced from its initial value in an imagewise manner corresponding to the spatially modulated X-ray radiation. The field strength at any location in photoelectric conversion layer 336 is reduced in proportion to the amount of radiation absorbed thereby, yielding a spatially distributed electric field pattern over photoelectric conversion layer 336. A corresponding weakening and spatial modulation of the electric field occurs across space 331.

As long as the electric field across photoelectric conversion layer 336 remains sufficiently strong, space charge effects are negligible and charge carrier transit takes place along generally straight field lines generally normal to the plane of photoelectric conversion layer 334, with virtually no sideways displacement (lateral spread) of charge which could cause blurring or scattering leading to a corresponding reduction in image resolution.

In order to relatively maintain high resolution as well as relatively high sensitivity to X-ray exposure, typically, the maximum reduction of the strength of any local electrical field (corresponding to maximum X-ray transmission through an object) over photoelectric conversion layer 334 should preferably not exceed approximately one-third of the initial sensitizing field strength corresponding to VS.

It may be appreciated from the foregoing discussion that, to maintain high resolution and X-ray sensitivity, the maximum dose of X-ray imaging radiation 166 preferably does not exceed the dose which reduces the local electrical field across photoelectric conversion layer 334 to two-thirds of its initial value.

The strong field across photoelectric conversion layer 336 which allows high spatial resolution and high X-ray sensitivity to be maintained during X-ray exposure, also causes an imagewise charge redistribution to occur during X-ray exposure within conductive electrode array 332. This redistribution yields a spatially modulated charge replica 354 in conductive electrode array 332 which tracks and mirrors the net charge pattern 352 at the top of photoelectric conversion layer 336. As a result, charge replica 354 also represents the transmission modulated X-ray imaging radiation 350.

It is a particular feature of the present invention that under the electrostatic conditions described hereinabove, the field lines across space 331 remain generally normal to the plane of ASV sensor 326 causing the charge distribution in the charge tracking layer 337 to generally track the net charge pattern and ASV of X-ray sensor 322. During exposure, as a result of changes in the ASV of X-ray sensor 322, corresponding charge redistribution occurs in the plate electrodes 274 (FIG. 10) of charge tracking layer 337. The charge redistribution causes measurable currents to flow through real-time radiation data electronics 328, providing a real-time indication of X-ray exposure on X-ray sensor 322.

A further advantage results from the presence of generally normal field lines across space 331, provided by the existence of a grounded electrode, such as the charge tracking layer 337 of ASV sensor 326, facing X-ray sensor 322. This advantage resides in the prevention of undercutting of the charge pattern 352 resulting from air ionization that may otherwise occur in space 331 during X-ray exposure. Moreover, it is a particular feature of the present invention that charge carriers of different polarities, created by ionization of air or another gas in space 331, transit in mutually opposing directions along the generally normal field lines to the charge tracking layer 337 and X-ray sensor 322. This arrangement further increases the sensitivity of X-ray sensor 322 to ionizing radiation while preventing ionization undercutting. In accordance with an alternative embodiment of the present invention, space 331 may be filled with an X-ray sensitive gas instead of air, thereby further to increase sensitivity of X-ray sensor 322.

Charge redistribution during exposure may be better understood by referring briefly to the equivalent circuit of FIG. 12. Switch 347 is disconnected during exposure since the charge injector is not activated. Since CP and CG are connected in parallel, charge depletion at CP due to photo-generation as a result of X-ray exposure causes charge redistribution at CG yielding measurable current at charge amplifier 346. Charge redistribution ends when the voltage across CG becomes equal to that across CP.

Referring back to FIG. 11B, the amount of X-ray radiation exposure is sensed by ASV sensor 326, and the X-ray radiation exposure is controlled using feedback from real-time radiation data readout electronics 328 to system host computer 34 (FIG. 1) as described herein to provide automatic exposure termination and dose control. Alternatively, X-ray exposure may be terminated after the elapse of a predetermined amount of time, set by a technologist.

Providing real-time radiation sensing functionality in image detection module 320 obviates the need for external phototimers or automatic exposure control (AEC) apparatus and methods. Elimination of such apparatus enables reduction of the distance separating the image detection module 320 from the object being imaged with correspondingly decreased image magnification. In addition, providing real-time radiation functionality sensing by image detection module 320 eliminates the need for calibration and correction which would otherwise be required to compensate for the differences in spectral sensitivities at different X-ray tube kVp values that would occur were an external AEC device to be used.

Moreover and importantly, real-time radiation data is sensed by ASV sensor 326 without interfering with or attenuating the actual imaging data, which corresponds to the spatial modulation of X-ray imaging radiation 350, detected by X-ray sensor 322.

It is appreciated that real-time radiation data is read out from the ASV sensor 326 during exposure only. During other stages in imaging, the ASV sensor has no role. Therefore the ASV sensor 326 is not illustrated in FIGS. 11A, 11C, and 11D.

Reference is now made to FIG. 11C which illustrates the reading of an X-ray image detected via X-ray sensor 322 by sequential line-by-line charge injection from sweeping elongate scanner 330 causing raster lines of the net charge pattern 352 to be sequentially generally uniformized.

Following exposure and prior to commencement of reading, bias voltage VB is adjusted to a value VR During reading, elongate scanner 330 sweeps across X-ray sensor 322 at a velocity v in the direction shown in FIG. 11C in synchronization with the operation of integrated radiation data readout electronics 324. Velocity v is determined and controlled by the electromechanical means which drive the motion of elongate scanner 330. During the sweep, charge injector 338 is activated and self-quenched charge injection from charge injector 338 into optical radiation blocking layer 336 occurs along elongate electrostatic barrier 340.

During the sweep of elongate scanner 330, the charge injector 338 may be periodically activated in bursts in accordance with a charge sampling time of a raster line as described hereinabove with reference to FIG. 8. Alternatively, the charge injector 338 may be continuously activated during reading, independently of the charge sampling time. In accordance with either embodiment, the time elapsed between subsequent charge sampling determines the width of each raster line of the image being read.

With each reading of a raster line during the sweep, elongate scanner 330, a new line of net charge pattern 352 along electrostatic barrier 340 is uniformized to an ASV value which generally corresponds to bias voltage VR. At regions on X-ray sensor 322 which are beyond the dynamic position of electrostatic barrier 340 during the sweep, the electric field is tailored by electrostatic barrier 340 to shield the ASV at X-ray sensor 322 from the charge injector 342. Thus, charge injection to regions beyond electrostatic barrier 340 is generally prevented. The ASV of X-ray sensor 322 at those regions maintains imagewise patterning in accordance with the X-ray image information.

It is appreciated that the region of X-ray sensor 322 exposed to charge injection in the x-direction during reading is typically limited in one x-direction by electrostatic barrier 340, but in the second x-direction no such spatial confinement typically exists. Thus, the region of X-ray sensor exposed to charge injection along the X-axis is typically greater than the width of one raster line and may comprise many raster lines. However, regions at which net charge pattern 352 has been made uniform, that is regions not shielded by electrostatic barrier 340, generally do not undergo further changes after uniformization, due to the self-quenching nature of the charge injection. Therefore, spatial charge replica 354 also undergoes line-by-line uniformization yielding line-by-line charge redistribution in accordance with the sweep of elongate scanner 330.

Line-by-line charge redistribution of spatial charge replica 354 causes measurable currents, associated with each new line of the X-ray image being read, in each electrode 221 (FIG. 8) of conductive electrode array 332. These flowing currents are sensed and read out by integrated data readout electronics 328 to provide an electrical signal representation of the transmission modulated X-ray imaging radiation 350. It is appreciated that reading is carried out, raster line by raster line, with the data from each pixel of the raster line being read preferably represented by the current flowing to/from a corresponding electrode 221 (FIG. 8). Since readout from all electrodes 221 (FIG. 8) is carried out in parallel, a frame of data including an entire image can be read out in seconds.

Reading may be better understood by referring briefly to the equivalent circuit of FIG. 12. During reading, switch 347 is connected, representing charge injection activation. The charge injection causes capacitor CP to be charged to the value VB=VR. Charging current is measured by charge amplifier 344.

Referring back to FIG. 11C, the current flowing due to charge redistribution in each electrode 221 (FIG. 8) of conductive electrode array 332 is generally composed of two components. The first component is the injection current, which is associated with charge injection into optical radiation blocking layer 336. The second component is the induction current, which is associated with capacitive charge induction caused by the sweep of the biased electrostatic barrier 340 of elongate scanner 330 over the net charge pattern 352 of X-ray sensor 352. It is a particular feature of the present invention that the structure and materials associated with elongate scanner 330, most specifically as related to elongate electrostatic barrier 340, described hereinabove with reference to FIG. 4 are chosen so as to generally minimize the induction current so as to render it negligible. Alternatively, when the structure of the elongate scanner causes a greater induction current, hardware-based mechanism and software based method as described in applicant's previous filed U.S. patent application Ser. No. 09/233,327 filed Jan. 20, 1999 can be used to factor out the induction current during image readout.

The dimensions of each pixel, and thereby the readout spatial resolution, are determined in the following manner:

In the transverse direction (y-direction), the pixel size is adjustable electronically, with the minimum pixel size determined by the pitch of conductive electrode 221 (FIG. 8) in conductive electrode array 332 as described herein, provided that the electric field across photoelectric conversion layer 334 is maintained as described herein.

In the x-direction, the pixel size, and thus the width of a raster line being read, is adjustable by the time elapsed between subsequent charge samplings, with the minimum pixel size determined by the spatial charge injection profile tailored by electrostatic barrier 340, provided that the electric field across photoelectric conversion layer 334 is maintained as described hereinabove.

Typically, read resolutions of approximately 2–6 line pairs/millimeter can be achieved in both the x- and y-directions.

Preferably, all raster lines comprising an X-ray image are read out during a single sweep of elongate scanner 330. Following the sweep, the ASV of X-ray sensor 322 is typically becoming uniform and equal to the readout bias voltage value VR. Preferably, the value of VR is determined using feedback from ASV sensor 326 to set a value for VR prior to the readout sweep which provides automatic tone scale remapping of the integrated radiation data read out from X-ray sensor 322 as described hereinbelow. Alternatively, when automatic tone scale remapping is unnecessary, readout bias voltage VR may be set to be equal to the sensitizing voltage VS. In this case, sensitizing X-ray sensor 322 is achieved as a byproduct of image readout.

It is appreciated that when optical radiation from an elongate light source 342 of elongate scanner 330 is be employed prior to X-ray exposure in order to illuminate photoelectric conversion layer 334, charge occupation of trap states thereacross occurs as described hereinabove. Occupying the trap states across photoelectric conversion layer 334 by optical radiation generally prevents the trapping of free charge carriers photogenerated therein in response to X-ray imaging radiation 350. Since trapping of charge carriers representing image information is thus avoided, imagewise de-trapping during subsequent imaging cycles is avoided. Instead, de-trapping occurs generally uniformly throughout photoelectric conversion layer 334 reducing ghosting problems at the expense of an increase in the dark current.

It is a particular feature of the present invention that increased dark current can be compensated for by factoring out a DC component and providing an automatic tone scale remapping of the image being read out as described hereinbelow. Therefore employing optical radiation to occupy trap states in photoelectric conversion layer 334 is suitable for reducing ghosting effects in accordance with the present invention.

Reference is now made to FIG. 11D which illustrates effective neutralization of the ASV of X-ray sensor 322. Neutralizing may be carried out as part of a standard imaging cycle or alternatively may be carried out periodically such as prior to a period when the image detection module 320 is expected to remain idle, thereby reducing the electrical stress across photoelectric conversion layer 334 during non-use.

The ASV of X-ray sensor 322 is typically neutralized by activating charge injector (not shown) of elongate scanner 330, applying a neutralizing bias voltage VN thereto and sweeping elongate scanner 330 across image detection module 322. VN is typically in the range of between about 0 volts down to minus several hundred volts. Following sweeping, the ASV of X-ray sensor 322 is neutralized or effectively reduced to a generally very low value relative to GND, resulting in neutralization of charge retained at optical radiation blocking layer 336.

Charge neutralization by charge injector 338 of elongate scanner 330 may be concurrent with the irradiation of X-ray sensor 322 by elongate light source 342 of elongate scanner 330.

Figure 13:
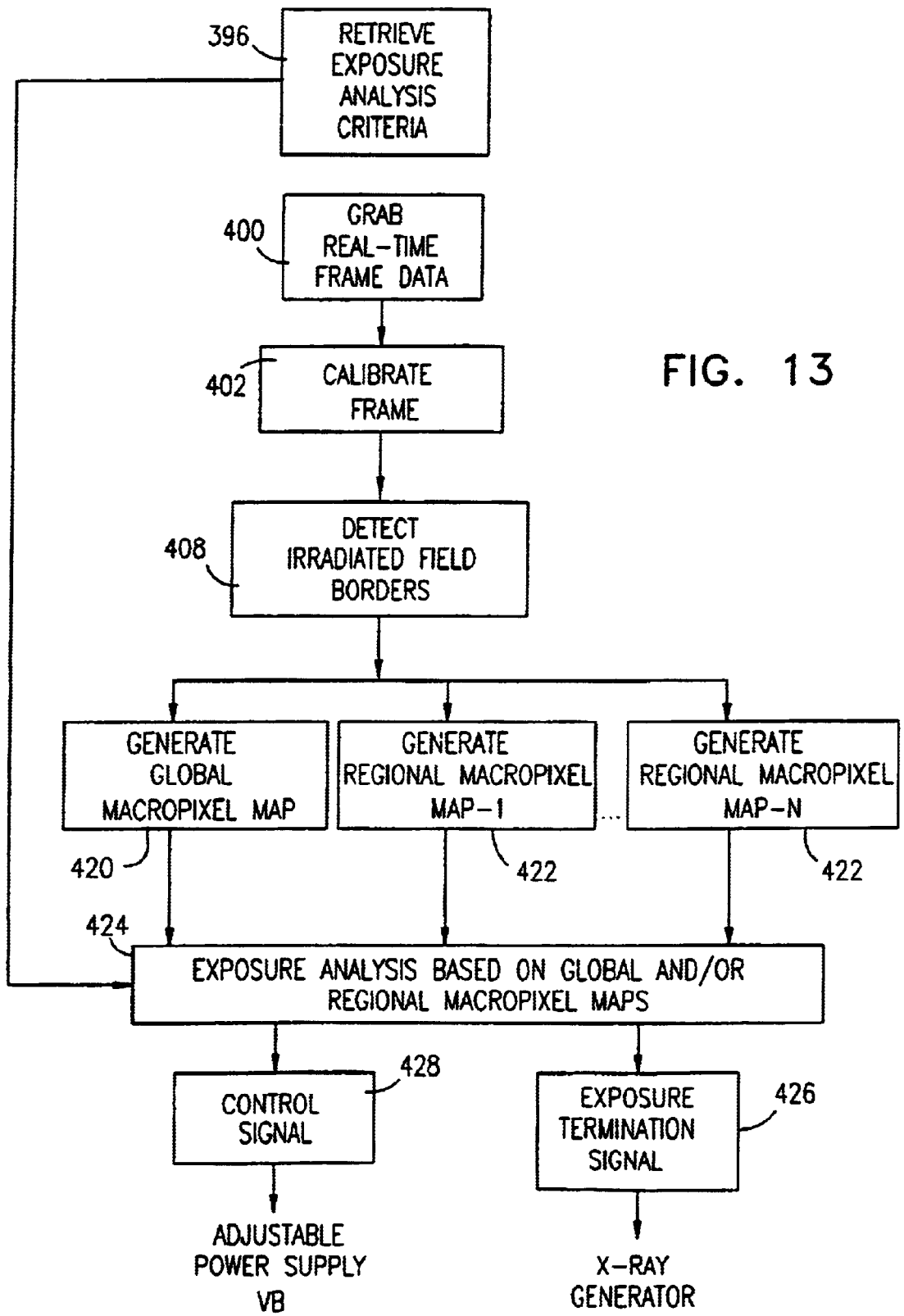
FIG. 13 is a block diagram showing the steps of detection of irradiated field borders in accordance with a preferred embodiment of the present invention.

Reference is now made to FIG. 13 which is a block diagram illustrating the steps of an algorithm for processing imagewise real-time exposure data from real-time radiation data electronics 328 (FIG. 11B) to provide an automatic exposure control for optimizing the X-ray dose and to set a bias value VR in accordance with a preferred embodiment of the present invention. The bias VR value, set prior to readout of integrated radiation data, as described hereinabove factors out a DC component, associated with the Fourier spectrum of spatial frequencies composing an X-ray image and which does not contribute imaging information, thus providing an automatic tone scale remapping function for an X-ray image being read. The DC component may be associated with a spatially non-modulated exposure component and with the dark decay of the photoelectric conversion layer 104 (FIG. 3).

It is appreciated that the algorithm described herein is executed during X-ray exposure by the real-time section of the data processor residing in system host computer 34 (FIG. 1). Exposure analysis criteria associated with the various types of examinations that are typically carried out in general radiography are stored in an examination library database in system host computer 34 (FIG. 1) and may be periodically updated.

Before exposure, exposure analysis criteria associated with the specific examination to be carried out are preferably retrieved from the examination library database as indicated by block 396. The exposure analysis criteria retrieved from the examination library database correspond to the type of examination to be carried out and details thereof such as anatomic region, patient build, etc.

During exposure, frame-by-frame grabbing of real-time exposure data occurs as indicated by block 400. Each frame preferably comprises the real-time exposure data, readout in the form of charges, from all plate electrodes 274 (FIG. 10) of the image detection module 30 (FIG. 1). Each plate electrode 274 (FIG. 10) is considered as one macropixel comprising one data element of the frame being grabbed.

As indicated in block 402, grabbed data is calibrated to compensate for offsets and gain variations in a manner known in the art. Frames of grabbed data, emerging in real-time during exposure, are used for detection of irradiated field borders as indicated in block 408.

The irradiated field is typically rectangular area of the image detection module 30 (FIG. 1) upon which primary X-ray radiation, modulated by the object to be imaged, directly impinges. The borders of the irradiated field are adjustable and are typically defined by collimator 24 (FIG. 1) in accordance with the region of interest which is being imaged such that the irradiated field contains the entire region of interest. In addition, the irradiated field may include background regions which receive maximum exposure that are typically background regions upon which non-attenuated X-ray impinged (no object).

It is appreciated that secondary X-ray radiation, produced by radiation scatter from the object being imaged is not limited by the collimator. Radiation scatter which may be reduced using the anti-scatter grid 32 (FIG. 1), typically impinges upon the image detection module 30 (FIG. 1) within and beyond the borders of the irradiated field. As a result of this scatter, the minimum exposure value inside the irradiated field corresponding to the object's maximum attenuation may in some cases be lower than the exposure values outside of the irradiated field borders.

The border detection approach described in accordance with the present invention is based upon detection of the maximum exposure value along each row and each column of macropixels or plate electrodes 274 (FIG. 10) of image detection module 30 (FIG. 1). Rows and columns of macropixels or plate electrodes 274 (FIG. 10) which do not traverse the irradiated field have significantly lower maximum exposure values than rows and columns which do traverse the irradiated field The detection of irradiated field borders shown in block 408 may be understood by additional reference to FIG. 14 which describes in detail the steps of detection of irradiated field borders in accordance with a preferred embodiment of the present invention.

Figure 14:
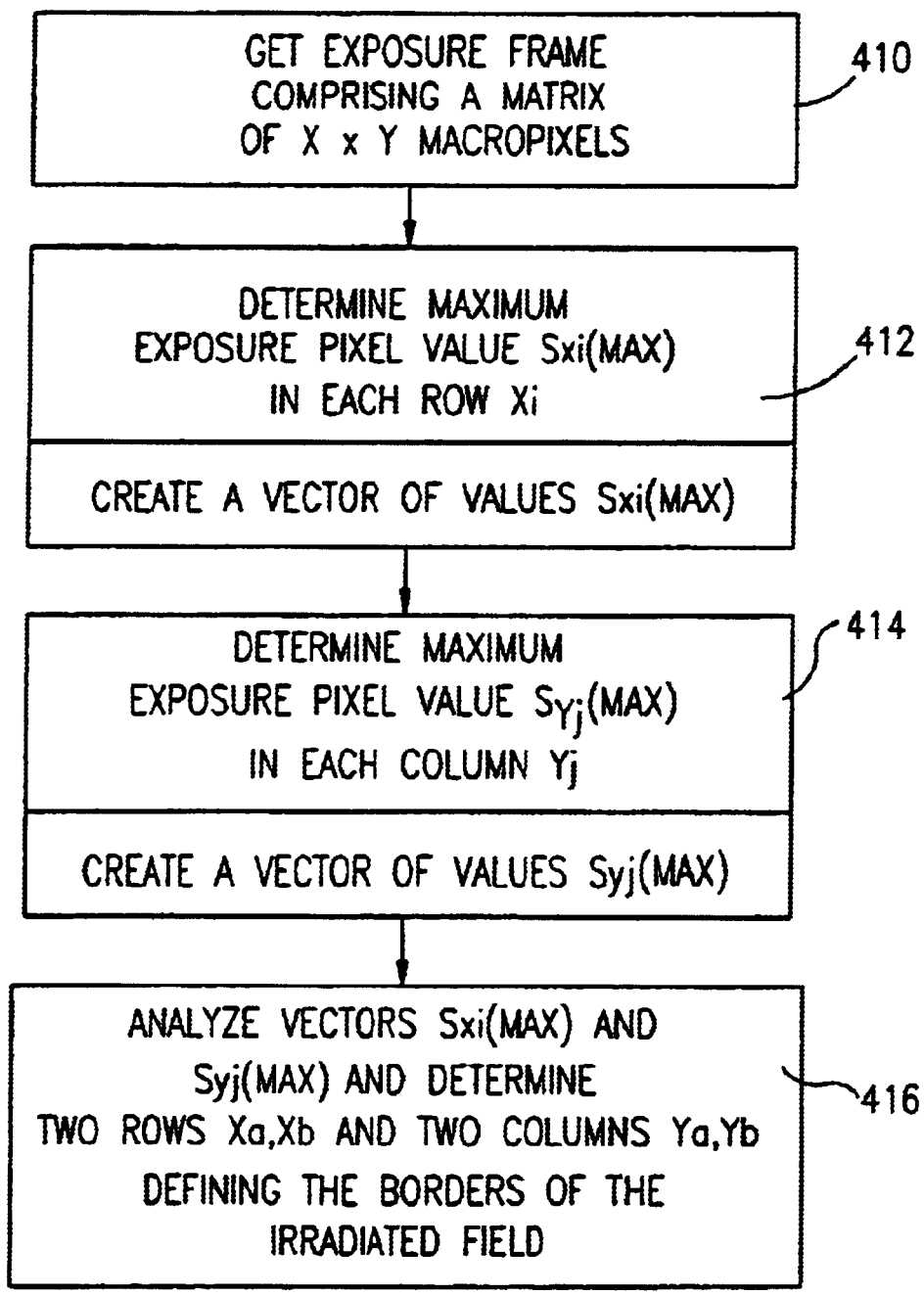
FIGS. 14 is a graphical illustration useful in understanding the border detection steps in accordance with a preferred embodiment of the present invention

As seen in FIG. 14, a frame of real-time exposure data, preferably grabbed in the form of a macropixel matrix having X rows and Y columns as described hereinabove, is loaded as indicated in block 410. Following loading, the exposure value from each macropixel of each row i is evaluated to determine the maximum exposure value $S_{Xi}$(MAX) for the row i. The maximum exposure values of all rows are calculated to create a vector comprising the $S_{Xi}$(MAX) values for all rows of macropixels as indicated by block 412.

Following evaluation, the exposure value of each macropixel of each column j of macropixels is evaluated to determine the maximum exposure value $S_{Yj}$(MAX) for the column j. The maximum exposure values of all columns are calculated to create a vector comprising the $S_{Yj}$(MAX) values for all columns of macropixels as indicated by block 414.

Each vector $S_{Xi}$(MAX) and $S_{Yj}$(MAX) is analyzed according to a threshold discrimination criterion, element by element, from the first vector element to the last element and from its last element to its first element in order to determine the two rows Xa and Xb and two columns Ya and Yb at which the predefined threshold is crossed, thereby defining borders of the irradiated field as indicated by block 416. It is appreciated that each border defining the irradiated field is typically determined with a positional accuracy of +/- one macropixel corresponding to the dimension of one plate electrode 274 (FIG. 10).

Various approaches to determining the threshold discrimination criterion can be implemented such as using the vector maximum value or averaged maximum peak values to provide a dose normalized threshold. Alternatively, other methods for determining the irradiated field during exposure may be implemented.

In the illustration of FIG. 10 a global cluster of macropixels (or plate electrodes 274) making up the irradiated field is indicated by reference numeral 294. Reference numerals 296 indicate regional clusters of macropixels within the borders of the irradiated field as described. It is appreciated that global cluster 294 is typically used for histogram analysis and that the regional clusters 296 are typically used for density analysis as described hereinbelow.

Referring back to FIG. 13, the step following determination of the irradiated field borders is the creation of a global macropixel map as indicated by block 420 and regional macropixel maps as indicated by blocks 422.

The global macropixel map contains the exposure tone values of all macropixels within global cluster 294 (FIG. 10), while the regional macropixel maps contain the exposure Lone values of regional clusters 296 (FIG. 10).

The locations of regional clusters 296 (FIG. 10) may be fixed with respect to the image detection module 30 (FIG. 1). Alternatively or additionally, the locations of regional clusters 296 (FIG. 10) may be adjustable with respect to the origin of the irradiated field 294.

The macropixels selected to form a regional cluster 294 (FIG. 10) may be determined in accordance with the exposure analysis criteria according to the type of examination to be carried out, as shown in block 396. Thus, each examination type may be associated with a unique regional cluster scheme which provides higher accuracy of exposure sensing for that specific examination.

During exposure, the global and/or one or more of the regional macropixel maps are comparatively analyzed as indicated by block 424 with respect to exposure analysis criteria retrieved from the examination library in accordance with the examination to be carried out as indicated by block 396. For example, the analysis may be based upon histogram comparison as known in the art to provide an exposure duration at which the image contrast in the region of interest reaches an acceptable value for diagnostic purposes. When the desired contrast level is reached, exposure is preferably terminated by sending an exposure termination signal to X-ray generator 40 (FIG. 1) as indicated by block 426. Alternatively, when exposure parameters arm input to the console (not shown) of X-ray generator 40 (FIG. 1), the exposure termination signal does not control the X-ray generator 40 (FIG. 1) and termination is carried out in a conventional manner not based on the exposure termination signal.

The duration of the actual exposure, which is typically shorter than the maximum expected exposure time discussed hereinabove is controlled by the output of the algorithm, thus providing dose control also known as automatic exposure control. It is appreciated that in no event will the duration of actual exposure be allowed to exceed the maximum expected exposure time in order to ensure safe operation of the imaging system.

In accordance with a preferred embodiment of the present invention, imagewise exposure data is available in real time and thus suitable known methods for real-time image analysis to determine image contrast of the global macropixel map and/or density levels of the regional macropixel maps may be implemented in a preferred embodiment of the present invention and used for automatic exposure control.

In addition to exposure control, a histogram of the global macropixel map may be analyzed, as known in the art, to determine an averaged exposure level within the irradiated field at the end of the exposure. The average exposure level, at the end of the X-ray exposure, is used to control and set the bias voltage VB (FIG. 7) as indicated by block 428 to the value VR which is desirable for readout of integrated radiation data. Determining the value VR using feedback from the ASV sensor 270 (FIG. 10) allows a DC component to be factored out from the integrated radiation data of the X-ray image. The DC component is associated with a component of the spatial Fourier frequencies composing an X-ray image being read which does not contribute any imaging information but does consume dynamic range. Factoring out the DC component thus effectively expands the dynamic range of integrated radiation readout electronics 223 (FIG. 8) and provides an automatic tone scale remapping function for the X-ray image being read out.

When a value for VR is selected as described above to provide tone scale remapping, the number of bits per pixel employed for the A/D converters 226 (FIG. 8) may be reduced from 12–14 bits to 8 bits, without losing any significant image information. This reduction simplifies and reduces the cost of integrated data readout electronics.

It will be appreciated by persons skilled in the art that the present invention is not limited by what has been described above. The scope of the present invention includes both combinations and sub-combinations of the various features described hereinabove as well as modifications and additions thereto which would occur to a person skilled in the art upon reading the foregoing disclosure and which are not in the prior art.

What is claimed is:

1. A multilayer ionizing radiation sensitive element including:
   a substrate;
   a conductive layer overlying said substrate;
   an ionizing radiation sensitive layer overlying said conductive layer, operative to convert ionizing radiation impinging thereon to charge carriers; and
   an ionizing radiation transmissive blocking layer exposed to ionizing radiation and optical radiation, overlying said ionizing radiation sensitive layer, which generally limits the passage of charges, of at least one polarity, therethrough and blocks optical radiation, of at least one spectral band, from penetrating therethrough, while permitting passage therethrough of ionizing radiation.

2. A multilayer ionizing radiation sensitive element according to claim 1 and further comprising a charge buffer layer, disposed between said ionizing radiation sensitive layer and said conductive layer and which generally limits the passage of charges, of at least a second polarity, therethrough.

3. A multilayer ionizing radiation sensitive element according to claim 1 and wherein said ionizing radiation sensitive layer is a photoconductor formed of doped amorphous selenium.

4. A multilayer ionizing radiation sensitive element according to claim 3, in which the doped amorphous selenium is made of amorphous selenium doped with arsenic and chlorine.

5. A multilayer ionizing radiation sensitive element according to claim 3 and wherein the charge buffer layer is formed of amorphous arsenic triselenide.

6. A multilayer ionizing radiation sensitive element according to claim 3 and wherein the blocking layer is formed of alkali doped selenium.

7. A multilayer ionizing radiation sensitive element according to claim 1 and wherein said ionizing radiation sensitive layer is a photoconductor selected from the group consisting of a selenium alloy, lead iodide, lead oxide thallium bromide, cadmium telluride, cadmium zinc telluride, cadmium sulfide, and mercury iodide.

8. A multilayer ionizing radiation sensitive element according to claim 1 and wherein the blocking layer is formed of a dielectric polymer carrier loaded with selected pigments or dyes.

9. A multilayer ionizing radiation sensitive element according to claim 1 and further comprising an interstitial dielectric passivation layer disposed between the ionizing radiation sensitive layer and the blocking layer.

10. A multilayer ionizing radiation sensitive element according to claim 9 and wherein the interstitial dielectric passivation layer is formed of poly-para-xylylenes.

11. A multilayer ionizing radiation sensitive element according to claim 1 and wherein the conductive layer is patterned.

12. A multilayer ionizing radiation sensitive element according to claim 10 and wherein the patterned conductive layer is selected from the group consisting of indium tin oxide (ITO), aluminum, gold, platinum, and chromium.

13. A multilayer ionizing radiation sensitive element according to claim 1 and wherein said substrate is selected from the group consisting of glass, ceramic, and metal coated with a dielectric material.

14. A multilayer ionizing radiation sensitive element according to claim 1 and wherein said at least one spectral band of optical radiation includes photons having energy higher than a characteristic band gap energy of said ionizing radiation sensitive layer and wherein optical radiation having photon energy lower than said band gap energy of said ionizing radiation sensitive layer generally penetrates through said blocking layer.

15. A multilayer ionizing radiation sensitive element according to claim 1 and wherein said ionizing radiation sensitive layer is sensitive to X-ray radiation.

* * * * *